US012593424B2

(12) United States Patent
Wong

(10) Patent No.: US 12,593,424 B2
(45) Date of Patent: Mar. 31, 2026

(54) HEAT DISSIPATION DEVICE

(71) Applicant: National Tsing Hua University, Hsinchu City (TW)

(72) Inventor: Shwin-Chung Wong, Hsinchu City (TW)

(73) Assignee: National TsingHua University, Hsinchu City (TW)

( * ) Notice: Subject to any disclaimer, the term of this patent is extended or adjusted under 35 U.S.C. 154(b) by 223 days.

(21) Appl. No.: 18/389,822

(22) Filed: Dec. 20, 2023

(65) Prior Publication Data

US 2025/0159841 A1 May 15, 2025

(30) Foreign Application Priority Data

Nov. 10, 2023 (TW) ................................. 112143357

(51) Int. Cl.
H05K 7/20 (2006.01)
F28D 15/02 (2006.01)
H01L 23/427 (2006.01)

(52) U.S. Cl.
CPC ..... H05K 7/20336 (2013.01); F28D 15/0275 (2013.01); H01L 23/427 (2013.01); H05K 7/2039 (2013.01)

(58) Field of Classification Search
CPC .............. H05K 7/20336; H05K 7/2039; H01L 23/427; F28D 15/0275; F28D 15/04; F28D 15/02; F28D 2021/0029; F28D 15/043; F28F 1/325
USPC .................................................... 165/104.26
See application file for complete search history.

(56) References Cited

U.S. PATENT DOCUMENTS

| | | | | |
|---|---|---|---|---|
| 6,212,074 B1 * | 4/2001 | Gonsalves | .......... | H01L 23/4006 |
| | | | | 174/16.3 |
| 6,650,544 B1 * | 11/2003 | Lai | ........................ | F28D 15/046 |
| | | | | 174/15.2 |
| 6,745,824 B2 * | 6/2004 | Lee | ..................... | F28D 15/0266 |
| | | | | 174/16.3 |
| 7,165,603 B2 * | 1/2007 | Mochizuki | ............ | H01L 23/427 |
| | | | | 165/104.21 |
| 7,278,470 B2 * | 10/2007 | Xia | ..................... | H01L 23/3672 |
| | | | | 165/104.21 |

(Continued)

FOREIGN PATENT DOCUMENTS

| | | |
|---|---|---|
| CN | 101573790 | 11/2009 |
| CN | 111278259 | 6/2020 |

(Continued)

OTHER PUBLICATIONS

"Office Action of Taiwan Counterpart Application", issued on May 6, 2024, p. 1-p. 8.

*Primary Examiner* — Jon T. Schermerhorn, Jr.
(74) *Attorney, Agent, or Firm* — JCIPRNET

(57) ABSTRACT

A heat dissipation device is adapted for dissipating heat from a heat source, and includes a vaper chamber, a heat pipe set and a heat dissipation fin set. The vapor chamber is adapted for thermal coupling to the heat source. The heat pipe set is adapted for thermal coupling to the heat source, the heat from the heat source is synchronously conducted to the vapor chamber and the heat pipe set. The vapor chamber is thermally coupled to the heat dissipation fin set, and the heat pipe set penetrates through the heat dissipation fin set.

2 Claims, 19 Drawing Sheets

(56) References Cited

U.S. PATENT DOCUMENTS

| | | | | |
|---|---|---|---|---|
| 7,370,693 B2* | 5/2008 | Lin | F28D 15/0275 | |
| | | | | 165/104.33 |
| 7,431,071 B2* | 10/2008 | Wenger | F28D 15/043 | |
| | | | | 165/47 |
| 7,974,096 B2* | 7/2011 | Refai-Ahmed | H01L 23/427 | |
| | | | | 361/679.52 |
| 8,330,337 B2* | 12/2012 | Yu | F21V 29/767 | |
| | | | | 313/46 |
| 10,288,356 B2* | 5/2019 | Lin | F28D 15/04 | |
| 11,576,279 B2* | 2/2023 | Chen | F28D 15/04 | |
| 11,935,808 B2* | 3/2024 | Mallik | H01L 23/3672 | |
| 12,111,113 B2* | 10/2024 | Lin | H05K 7/2039 | |
| 12,146,714 B2* | 11/2024 | Lin | H05K 7/20418 | |
| 12,181,224 B2* | 12/2024 | Chang | G06F 1/20 | |
| 12,274,030 B2* | 4/2025 | Chen | H05K 7/2039 | |
| 12,446,192 B2* | 10/2025 | Lin | H05K 7/20327 | |
| 2002/0080583 A1 | 6/2002 | Prasher et al. | | |
| 2005/0178532 A1* | 8/2005 | Meng-Cheng | H01L 23/427 | |
| | | | | 165/104.33 |
| 2008/0283222 A1* | 11/2008 | Chang | H01L 23/427 | |
| | | | | 165/104.26 |
| 2009/0025907 A1* | 1/2009 | Wenger | F28D 15/0266 | |
| | | | | 165/80.3 |
| 2009/0025909 A1* | 1/2009 | Huang | F28D 15/0275 | |
| | | | | 165/104.26 |
| 2009/0059524 A1* | 3/2009 | Peng | H01L 23/427 | |
| | | | | 361/709 |
| 2009/0266518 A1* | 10/2009 | Huang | F28D 15/0266 | |
| | | | | 165/104.19 |
| 2011/0305020 A1* | 12/2011 | Wang | F21V 5/04 | |
| | | | | 362/249.02 |
| 2012/0152496 A1* | 6/2012 | Liu | H01L 23/427 | |
| | | | | 165/104.26 |
| 2012/0160455 A1* | 6/2012 | Liu | H01L 23/427 | |
| | | | | 29/890.053 |
| 2012/0312509 A1* | 12/2012 | Yuan | G06F 1/20 | |
| | | | | 165/104.26 |
| 2013/0043006 A1* | 2/2013 | Peng | H01L 23/3672 | |
| | | | | 165/104.26 |
| 2013/0228311 A1* | 9/2013 | Wu | H01L 23/427 | |
| | | | | 29/890.03 |
| 2017/0252878 A1* | 9/2017 | Lin | B23P 15/26 | |
| 2019/0132938 A1 | 5/2019 | Mira et al. | | |
| 2020/0196482 A1* | 6/2020 | Chiang | H05K 7/20154 | |
| 2021/0088293 A1* | 3/2021 | Shen | F28F 3/12 | |
| 2021/0123686 A1* | 4/2021 | Lin | H01L 21/4871 | |
| 2021/0180877 A1 | 6/2021 | Wong | | |
| 2021/0327785 A1* | 10/2021 | Lin | F28D 15/0275 | |
| 2023/0243596 A1* | 8/2023 | Lin | F28D 15/0275 | |
| | | | | 165/104.21 |
| 2024/0102741 A1* | 3/2024 | Yang | H01L 23/427 | |
| 2024/0111269 A1* | 4/2024 | Jaggers | G06F 1/20 | |
| 2024/0114646 A1* | 4/2024 | Jaggers | H05K 7/2029 | |
| 2024/0114657 A1* | 4/2024 | Helberg | H05K 7/2039 | |
| 2024/0334652 A1* | 10/2024 | Fu | H01L 21/4882 | |
| 2025/0133697 A1* | 4/2025 | Zhong | F28D 15/0275 | |
| 2025/0159841 A1* | 5/2025 | Wong | H05K 7/20336 | |

FOREIGN PATENT DOCUMENTS

| | | | | |
|---|---|---|---|---|
| JP | 2009198173 | 9/2009 | | |
| TW | M240603 | 8/2004 | | |
| TW | M252255 | 12/2004 | | |
| TW | I403257 | 7/2013 | | |
| TW | M606856 | 1/2021 | | |
| TW | M616791 | 9/2021 | | |
| TW | M629048 | 7/2022 | | |
| TW | I888109 B | * | 6/2025 | F28D 15/0266 |

* cited by examiner

HEAT DISSIPATION DEVICE

CROSS-REFERENCE TO RELATED APPLICATION

This application claims the priority benefit of Taiwan application Ser. No. 112143357, filed on Nov. 10, 2023. The entirety of the above-mentioned patent application is hereby incorporated by reference herein and made a part of this specification.

BACKGROUND

Technical Field

The invention relates to a heat dissipation device, and particularly relates to a heat dissipation device with high heat dissipation efficiency.

Description of Related Art

In recent years, rapid development of high-power chips (such as AI chips) has led to a significant increase in the demand for heat dissipation of high-power servers (>400 W). Therefore, to provide a heat dissipation device with high heat dissipation efficiency is a goal of research in this field.

SUMMARY

The invention is directed to a heat dissipation device, which has high heat dissipation efficiency.

The invention provides a heat dissipation device, which is adapted to dissipate heat of a heat source, and includes a vaper chamber, a heat pipe set and a heat dissipation fin set. The vapor chamber is adapted for thermal coupling to the heat source. The heat pipe set is adapted for thermal coupling to the heat source, where heat from the heat source is synchronously conducted to the vapor chamber and the heat pipe set. The vapor chamber is thermally coupled to the heat dissipation fin set, and the heat pipe set penetrates through the heat dissipation fin set.

In an embodiment of the invention, the heat dissipation device further includes a heat conduction structure adapted to contact the heat source. The vapor chamber and the heat pipe set are in direct contact with the heat conduction structure. The heat from the heat source is synchronously conducted to the vapor chamber and the heat pipe set through the heat conduction structure.

In an embodiment of the invention, the heat conduction structure includes a body and an extending portion extending from a side surface of the body. The vapor chamber directly contacts a top surface of the body. The extending portion extends to the heat pipe set. The heat pipe set includes a side portion. The side portion is located between the extending portion and the vapor chamber, and is in direct contact with the extending portion and the vapor chamber.

In an embodiment of the invention, the body includes a cavity facing away from the top surface and adapted to accommodate at least a part of the heat source.

In an embodiment of the invention, the heat conduction structure includes a body, the vapor chamber directly contacts a top surface of the body, the heat pipe set includes a side portion, the side portion contacts a side surface of the body, and a bottom surface of the body and the side portion contact the heat source.

In an embodiment of the invention, the vapor chamber directly contacts a top surface of the heat source, the heat pipe set includes a side portion, and the side portion directly contacts a side surface of the heat source.

In an embodiment of the invention, the heat dissipation fin set includes an upper half and a lower half. The lower half is located between the upper half and the vapor chamber. The heat pipe set includes a round tube portion, and the round tube portion penetrates through the upper half of the heat dissipation fin set.

In an embodiment of the invention, the vapor chamber includes a first casing, which includes a first plate portion and a first side wall protruding from an inner surface of the first plate portion, where the heat source is adapted to contact an outer surface of the first plate portion; a second casing, which is stacked on the first casing, the second casing includes a second plate portion, a plurality of support columns protruding from the second plate portion and a second side wall protruding from the second plate portion and surrounding the support columns, where the first side wall is bonded to the second side wall, and a plurality of steam channels are formed between the support columns; and a capillary structure, which is arranged between the first plate portion and the support columns of the second casing.

In an embodiment of the invention, the first casing includes a first capillary structure located on the inner surface of the first plate portion and surrounded by the first side wall. The capillary structure is a second capillary structure, and the second capillary structure is arranged between the first capillary structure and the support columns of the second casing.

In an embodiment of the invention, the vapor chamber further includes a third capillary structure disposed on the inner surface of the first plate portion in an area corresponding to the heat source.

In an embodiment of the invention, the first capillary structure includes a plurality of grooves. At least a part of the grooves may be arranged radially.

In an embodiment of the invention, the vapor chamber includes a first casing, a first capillary structure and a second casing. The first casing includes a first plate portion, a plurality of first protruding portions protruding from an inner surface of the first plate portion, and a first side wall protruding from the inner surface and surrounding the first protruding portions, where the heat source is adapted to contact an outer surface of the first plate portion. The first capillary structure is disposed above the inner surface of the first plate portion and surrounds the first protruding portions. The second casing is stacked on the first casing. The second casing includes a second plate portion, a plurality of second protruding portions protruding from the second plate portion, and a second side wall protruding from the second plate portion and surrounding the second protruding portions, where the first side wall is bonded to the second side wall, a plurality of steam channels are formed between the second protruding portions, and the second plate portion includes a plurality of bonding areas provided through displacement of the second protruding portions, the first protruding portions are bonded to the bonding areas, and the second protruding portions lean against the first capillary structure.

In an embodiment of the invention, the first casing includes a second capillary structure integrally protruding from the inner surface of the first plate portion, the second capillary structure includes a plurality of grooves formed between a plurality of ridges to serve as liquid channels. The first capillary structure is disposed between the second capillary structure and the second protruding portions of the second casing.

In an embodiment of the invention, the vapor chamber further includes a third capillary structure, which is filled in the grooves in an area corresponding to the heat source. The third capillary structure includes metal powder or unwoven metal felt.

In an embodiment of the invention, the second protruding portions include a plurality of first support columns and a plurality of second support columns. Shapes of the first support columns are different from shapes of the second support columns. The first support columns are arranged at a portion corresponding to the heat source, and the second support columns are located next to the first support columns and extend along an axial direction.

Based on the above description, the vapor chamber and the heat pipe set of the heat dissipation device of the invention are adapted for thermal coupling to the heat source, and the heat from the heat source is synchronously conducted to the vapor chamber and the heat pipe set. The vapor chamber is thermally coupled to the heat dissipation fin set, and the heat pipe set penetrates through the heat dissipation fin set. Therefore, the heat from the heat source may be synchronously conducted to the vapor chamber and the heat pipe set, and a heat dissipation path may be increased to effectively improve the heat dissipation efficiency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
FIG. 1A is a schematic diagram of a heat dissipation device according to an embodiment of the invention.
Figure 1A:
Figure 1B:
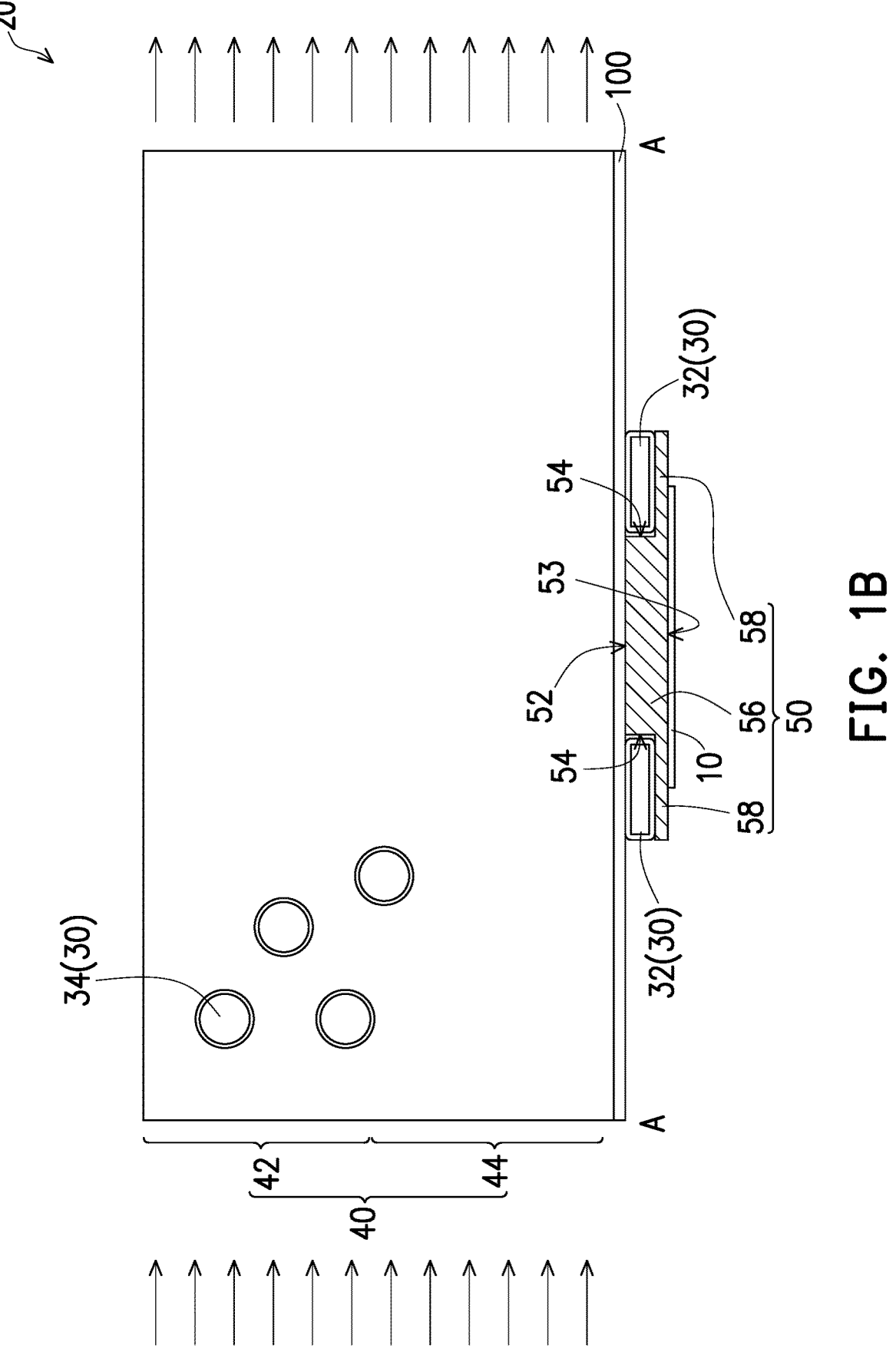
FIG. 1B is a schematic cross-sectional view of the heat dissipation device of FIG. 1A along a section line A-A.

FIG. 1A is a schematic diagram of a heat dissipation device according to an embodiment of the invention. FIG. 1B is a schematic cross-sectional view of the heat dissipation device of FIG. 1A along a section line A-A. Referring to FIG. 1A and FIG. 1B, a heat dissipation device 20 of the embodiment is adapted to dissipate heat from a heat source 10. The heat source 10 is, for example, a central processing unit of a motherboard, but the heat source 10 may also be other chips, and the type and quantity of the heat sources 10 are not limited thereto.

The heat dissipation device 20 includes a vapor chamber 100, a heat pipe set 30 and a heat dissipation fin set 40. The vapor chamber 100 is, for example, an ultra-thin vapor chamber (UTVC), but the type of the vapor chamber 100 is not limited thereto. The heat pipe set 30 includes a plurality of heat pipes. The vapor chamber 100 and the heat pipe set 30 are thermally coupled to the heat source 10. The heat from the heat source 10 is synchronously conducted to the vapor chamber 100 and the heat pipe set 30. The vapor chamber 100 is thermally coupled to the heat dissipation fin set 40, and the heat pipe set 30 penetrates through the heat dissipation fin set 40.

In the embodiment, the heat dissipation device 20 may further optionally include a heat conduction structure 50. A material of the thermal conduction structure 50 is, for example, copper, but the invention is not limited thereto. In the embodiment, the heat conduction structure 50 directly contacts the heat source 10, and the vapor chamber 100 and the heat pipe set 30 directly contact the heat conduction structure 50. The heat from the heat source 10 is synchronously conducted to the vapor chamber 100 and the heat pipe set 30 via the heat conduction structure 50.

Specifically, the heat conduction structure 50 includes a body 56 and an extending portion 58 extending from a side surface 54 of the body 56. The vapor chamber 100 directly contacts a top surface 52 of the body 56, and the extending portion 58 extends to the bottom of the heat pipe set 30. FIG. 1B shows that the extending portion 58 extends to the bottom of the heat pipe set 30, but the extending portion 58 may also extend to the top of the heat pipe set 30.

The heat pipe set 30 includes a round tube portion 34 and a side portion 32. The round tube portion 34 penetrates through the heat dissipation fin set 40, and the side portion 32 is located between the extending portion 58 and the vapor chamber 100, and directly contacts the extending portion 58 and the vapor chamber 100. A design of the side portion 32 may reduce a height and increase a contact area with the heat conduction structure 50 to improve a heat conduction effect.

In addition, in the embodiment, the side portion 32 does not contact the side surface 54 of the body 56. In other embodiments, the side portion 32 may also contact the side surface 54 of the body 56. In an embodiment, the heat conduction structure 50 may also be a cuboid without the extending portion 58, and the side portion 32 directly contacts the side surface 54 of the body 56.

In addition, the heat dissipation fin set 40 includes an upper half 42 and a lower half 44. The lower half 44 is located between the upper half 42 and the vapor chamber 100. The round tube portion 34 of the heat pipe set 30 penetrates through the upper half 42 of the heat dissipation fin set 40. Since the upper half 42 of the heat sink fin set 40 is cooler than the lower half 44, such design allows the heat generated by the heat source 10 to be quickly brought to the upper half 42 of the heat dissipation fin set 40 by the heat pipe set 30, which may effectively improve the heat dissipation efficiency of the heat dissipation fin set 40 and meanwhile reduce a heat load of the vapor chamber 100. After simulation, the heat dissipation device 20 of the invention may effectively meet a heat dissipation requirement of the heat source 10 exceeding 1000 W.

Figure 1C:
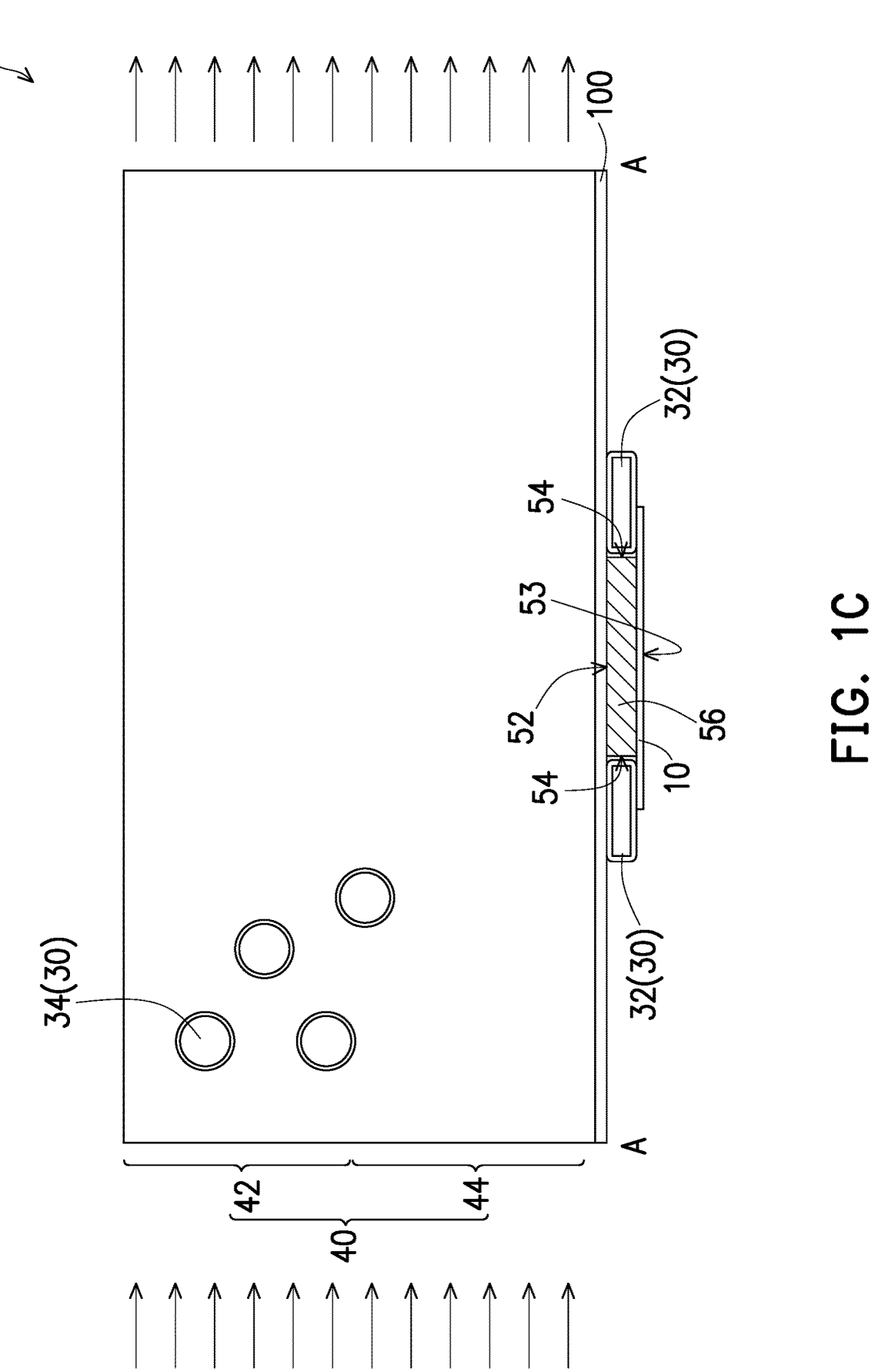
FIG. 1C is a schematic cross-sectional view of a heat dissipation device according to another embodiment of the invention.

FIG. 1C is a schematic cross-sectional view of a heat dissipation device according to another embodiment of the invention. Referring to FIG. 1C, in the embodiment, the heat conduction structure only has the body 56 without the extending portion. The heat source 10 directly contacts a bottom surface 53 of the body 56 and the side portion 32 of the heat pipe set 30. The vapor chamber 100 directly contacts a top surface 52 of the body 56, and the side portion 32 of the heat pipe set 30 contacts the side surface 54 of the body 56. The heat from the heat source 10 is synchronously transferred to the side portion 32 of the heat pipe set 30 and the body 56, and is synchronously transferred to the vapor chamber 100 and the side portion 32 of the heat pipe set 30 through the body 56.

Figure 2A:
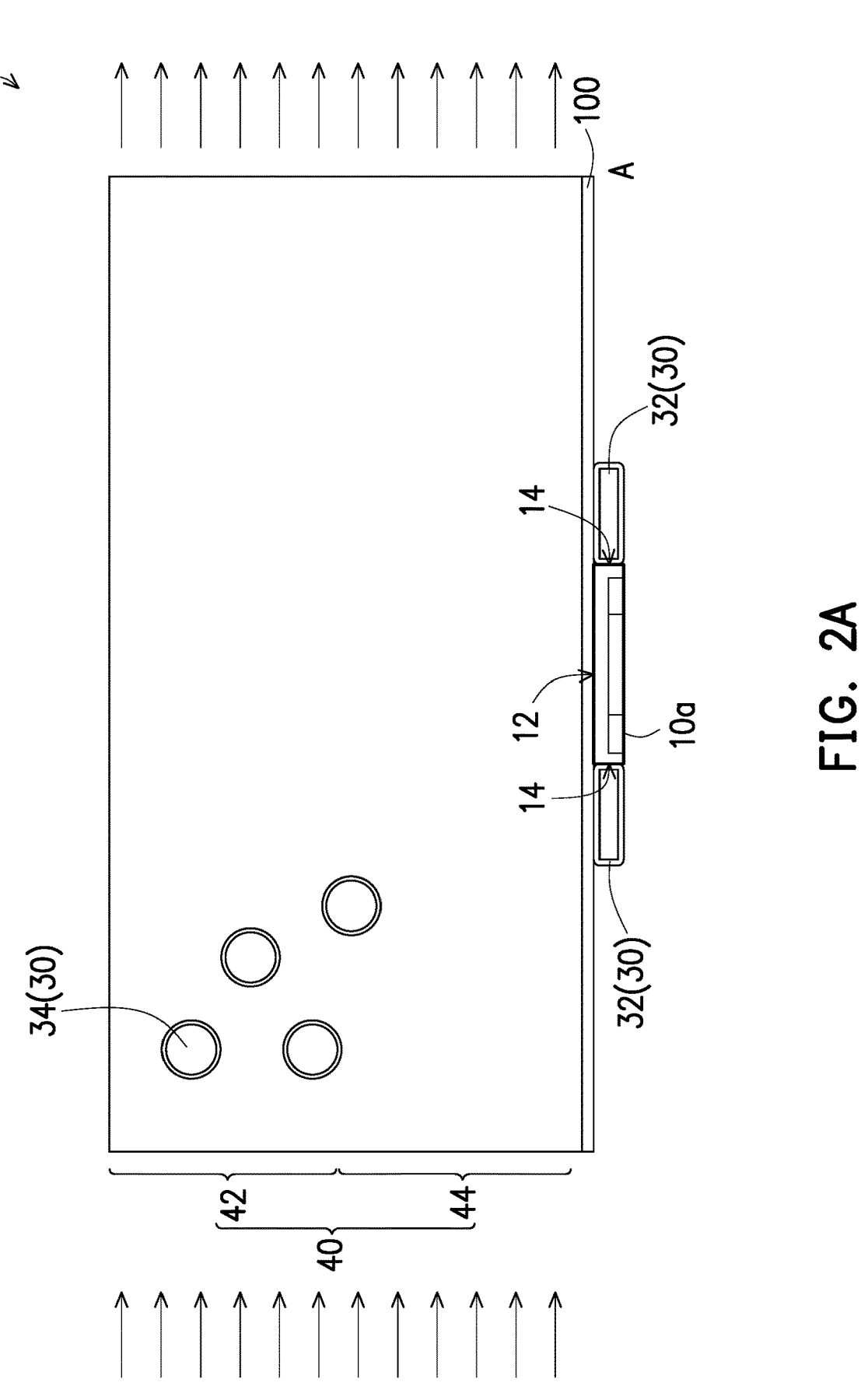
FIG. 2A to FIG. 2B are schematic cross-sectional views of various heat dissipation devices according to other embodiments of the invention.
Figure 2B:
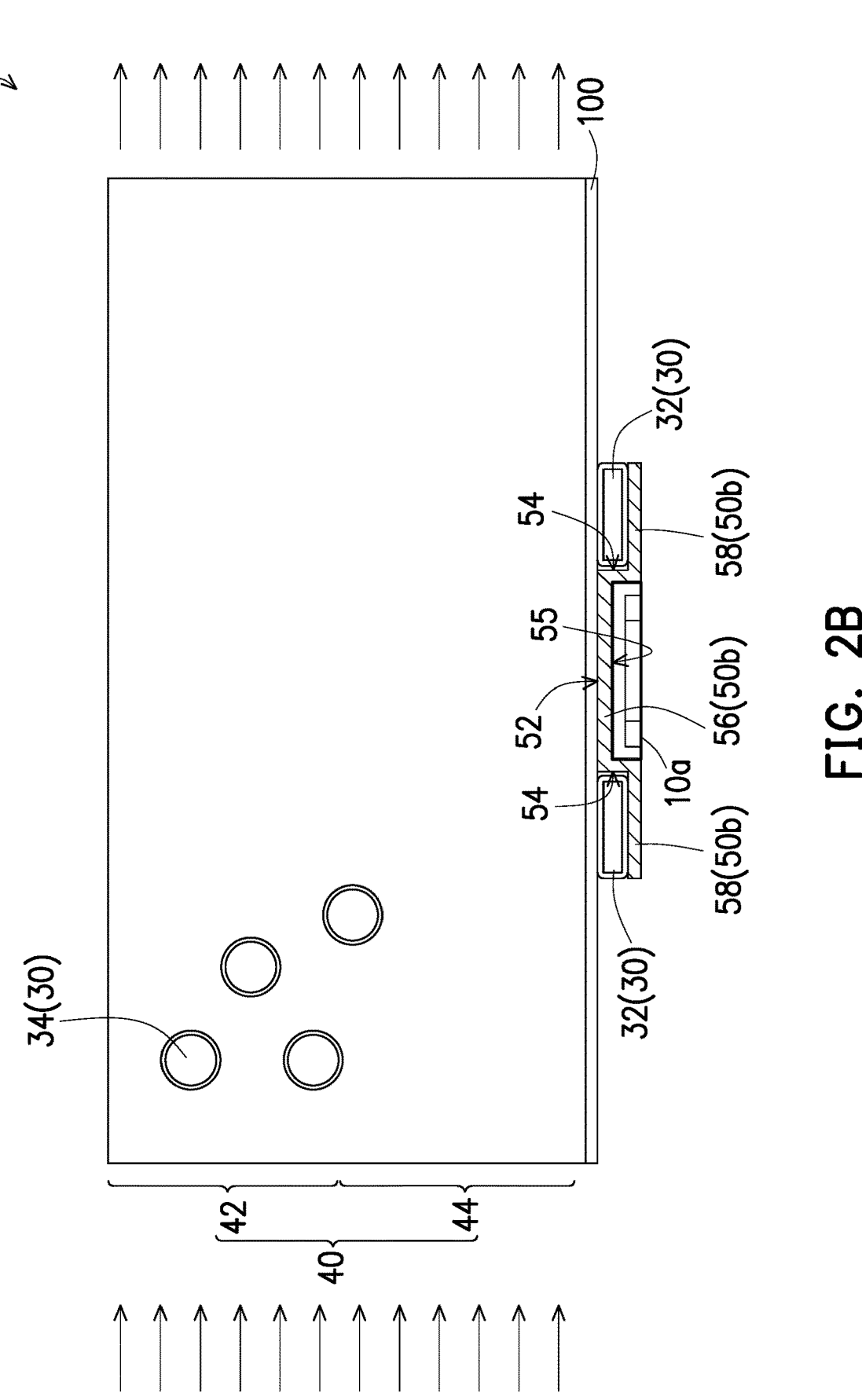

FIG. 2A to FIG. 2B are schematic cross-sectional views of various heat dissipation devices 20 according to other embodiments of the invention. Referring to FIG. 2A first, a main difference between FIG. 2A and FIG. 1B is that a volume of the heat source 10 in FIG. 1B is smaller and flat, and the heat source 10 transfers heat to the heat pipe set 30 and the vapor chamber 100 through the heat conduction structure 50. A volume of a heat source 10a in FIG. 2A is relatively large, and in addition to a chip, the heat source 10a further includes an integrated heat sink (IHS). For this type of heat source 10a, limited by space, a heat dissipation device 20a of the embodiment omits the heat conduction structure 50. The vapor chamber 100 directly contacts a top surface 12 of the heat source 10a, and the side portion 32 of the heat pipe set 30 directly contacts a side surface 14 of the heat source 10a.

Similarly, the heat from the heat source 10a is synchronously conducted to the vapor chamber 100 and the heat pipe set 30. A part of the heat is transferred upward through the vapor chamber 100 to the lower half 44 of the heat dissipation fin set 40, and a part of the heat is transferred upward through the heat pipe set 30 to the upper half 42 of the heat dissipation fin set 40 to improve heat dissipation efficiency.

Referring to FIG. 2B again, a main difference between FIG. 2B and FIG. 1B is that since the heat source 10 in FIG. 1B has a smaller volume and is flat, the bottom surface 53 of the heat conduction structure 50 is attached to the heat source 10. The heat source 10a of FIG. 2B has a larger volume and further includes an HIS, the body 56 of a heat conduction structure 50b may have a cavity 55 to accommodate at least a part of the heat source 10a to reduce an overall height.

Similarly, the vapor chamber 100 directly contacts the top surface 52 of the body 56, and the side portion 32 of the heat pipe set 30 is located between the extending portion 58 and the vapor chamber 100, and directly contacts the extending portion 58 and the vapor chamber 100. Such a design allows the heat from the heat source 10a to be synchronously conducted to the vapor chamber 100 and the heat pipe set 30 through the heat conduction structure 50b. A part of the heat is transferred upward to the lower half 44 of the heat dissipation fin set 40 through the heat conduction structure 50b and the vapor chamber 100, and a part of the heat is transferred upward to the upper half 42 of the heat dissipation fin set 40 through the heat conduction structure 50b and the heat pipe set 30, so as to improve the heat dissipation efficiency.

Figure 3:
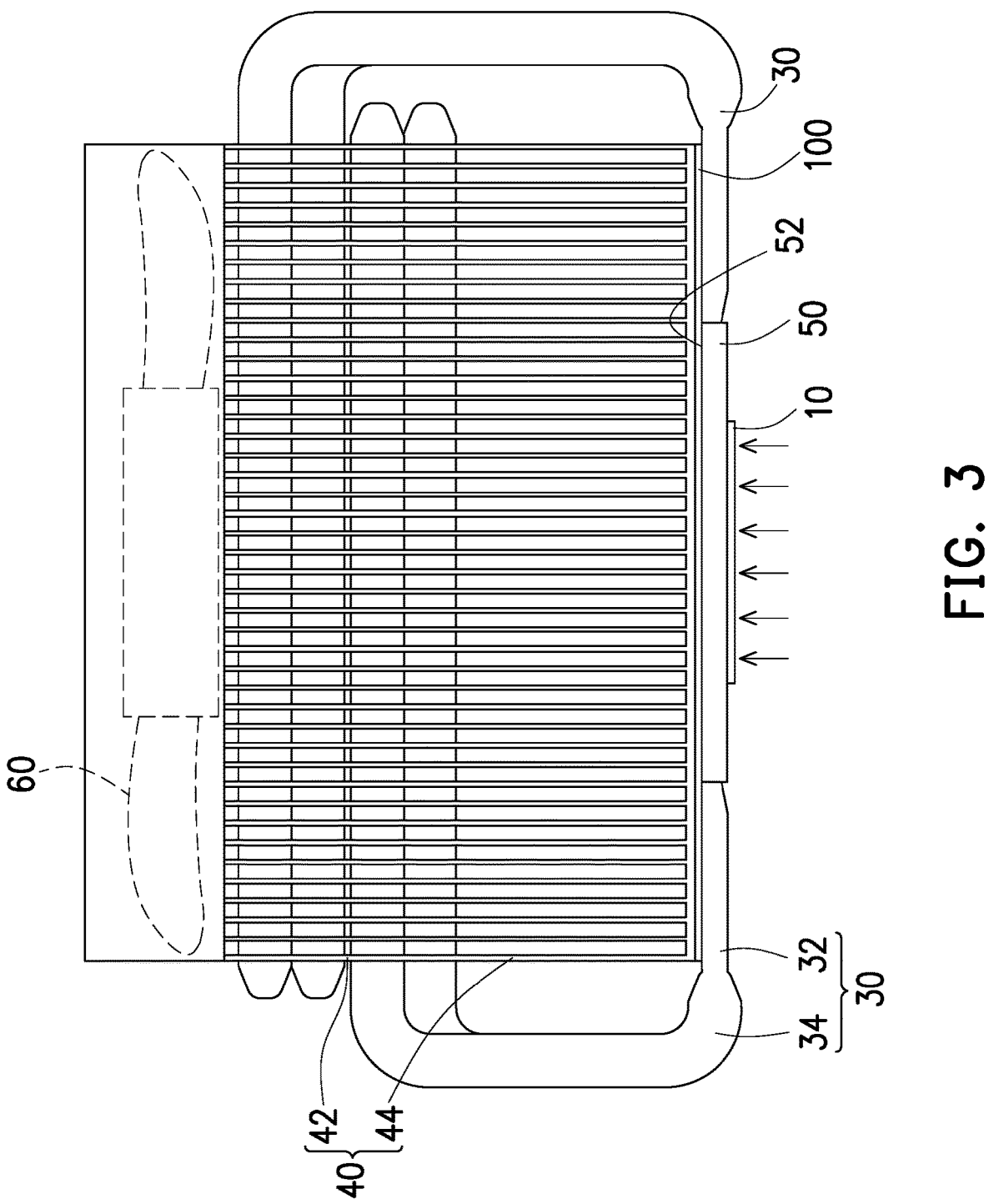
FIG. 3 is a schematic diagram of a heat dissipation device according to another embodiment of the invention.

FIG. 3 is a schematic diagram of a heat dissipation device according to another embodiment of the invention. Referring to FIG. 3, the heat dissipation device 20 of FIG. 3 further includes a fan 60. The fan 60 is, for example, disposed above the heat dissipation fin set 40. The wind from the fan 60 blows toward the heat dissipation fin set 40 below, but the position and wind direction of the fan 60 are not limited thereto. In addition, in the embodiment, a width of the fan 60 is approximately the same as a width of the heat dissipation fin set 40, so that the heat of the heat dissipation fin set 40 may be fully taken away by the wind of the fan 60, thereby improving the heat dissipation efficiency.

In addition, based on the synchronous conduction of heat from the heat sources 10 and 10a to the vapor chamber 100 and the heat pipe set 30 mentioned above, there are also various designs for the vapor chamber 100 to improve the heat dissipation effect, which will be explained below. It should be noted that although the vapor chamber introduced below, for example, directly contact the heat source 10, it may also directly contact the heat conduction structures 50 and 50b. Namely, the vapor chamber in the embodiments of FIG. 1A to FIG. 2B may adopt the vapour chambers described below.

Figure 4A:
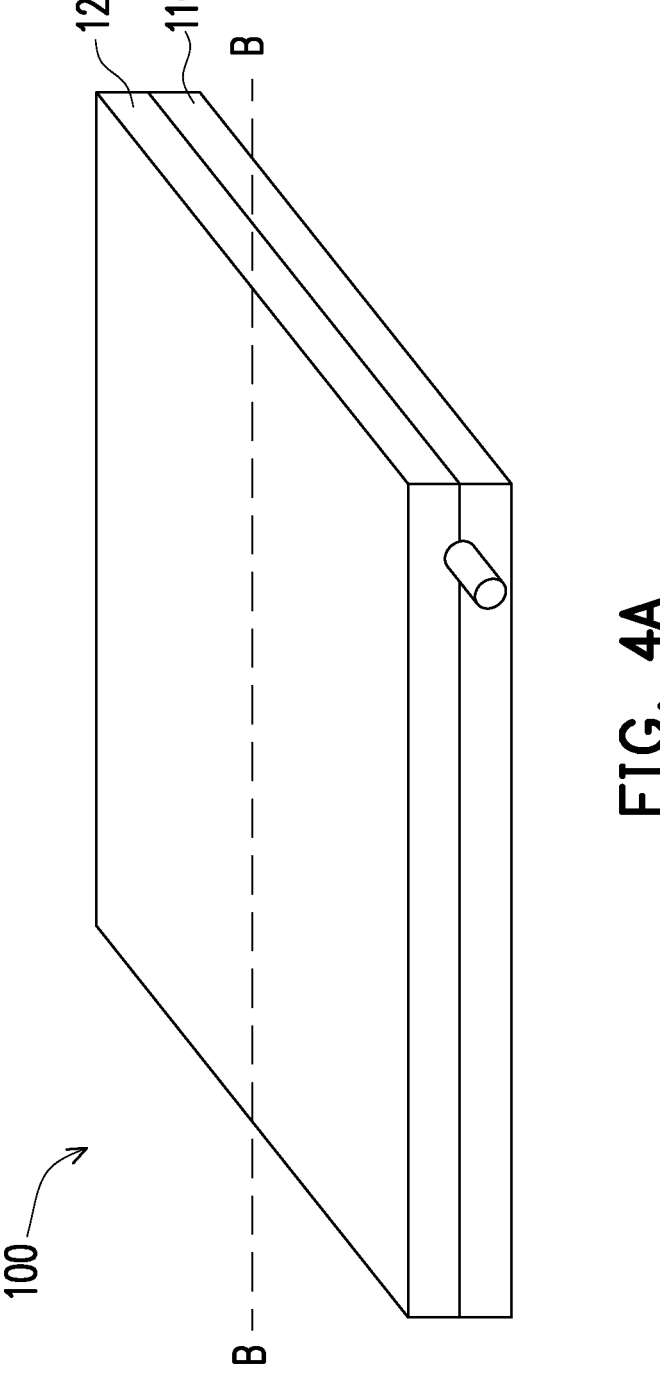
FIG. 4A is a schematic view of an appearance of a vapor chamber of the heat dissipation device of FIG. 2A.
Figure 4B:
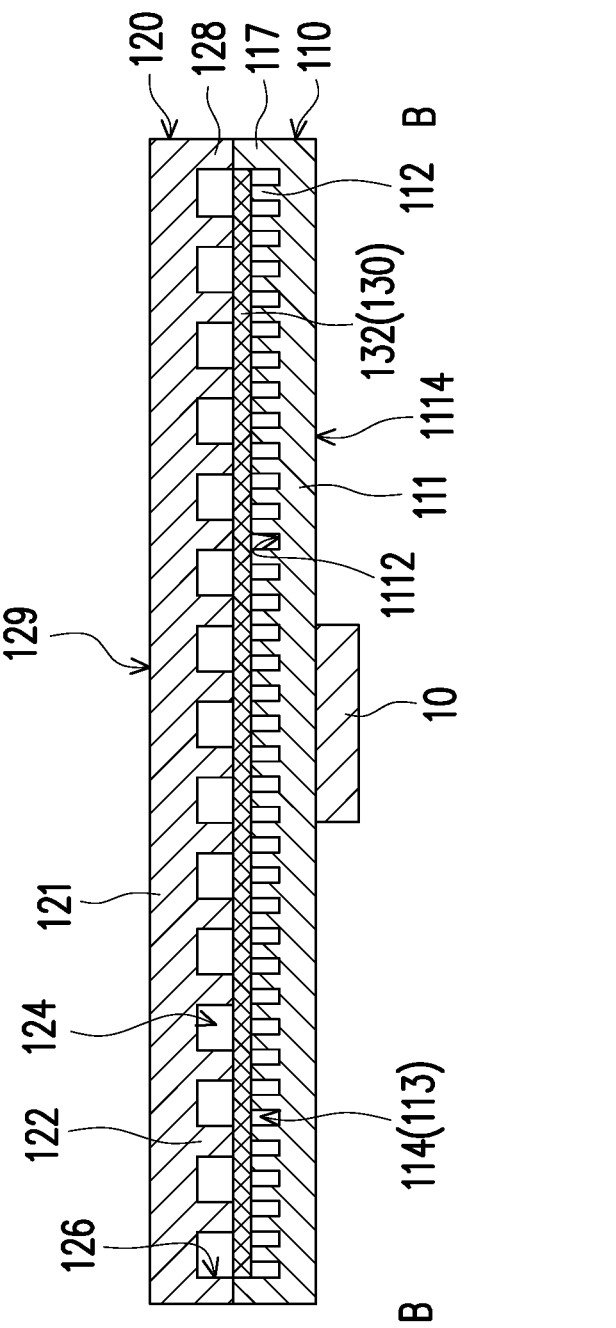
FIG. 4B is a schematic cross-sectional view of the vapor chamber of FIG. 4A along a section line B-B.

FIG. 4A is a schematic view of an appearance of a vapor chamber of the heat dissipation device of FIG. 2A. FIG. 4B is a schematic cross-sectional view of the vapor chamber of FIG. 4A along a section line B-B. It should be noted that a shape of the appearance of the vapor chamber in FIG. 4A is, for example, a rectangular plate body, but the invention is not limited thereto.

Referring to FIG. 4A and FIG. 4B, the vapor chamber 100 of the embodiment includes a first casing 110 and a second casing 120. As shown in FIG. 4B, the first casing 110 includes a first plate portion 111, a first capillary structure 113 located on an inner surface 1112 of the first plate portion 111, and a first side wall 117 protruding from the inner surface 1112 and surrounding the first capillary structure 113. The heat source 10 is adapted to contact a first casing outer surface 1114 of the first plate portion 111 to transfer the thermal energy generated by the heat source 10 to the vapor chamber 100.

In the embodiment, the first capillary structure 113 includes a plurality of grooves 114 formed between a plurality of ridges 112. More specifically, these ridges 112 protrude from the inner surface 1112 of the first plate portion 111, so that one of the grooves 114 is defined between two adjacent ones of the ridges 112. The first capillary structure 113 adopts the design of the grooves 114 to provide a smaller flow resistance. In the embodiment, a width of the groove 114 is, for example, between 50 μm and 200 μm, and a depth of the groove 114 is, for example, between 50 μm and 200 μm. However, the width and depth of the groove 114 are not limited thereto.

Therefore, as shown in FIG. 4B, the vapor chamber 100 further includes a second capillary structure 130. The second capillary structure 130 is disposed between the first capillary structure 113 and the support columns 122 to cover the first capillary structure 113.

In addition, in the embodiment, the first plate portion 111 and the ridges 112 are integrally formed, and such a design may have a simpler structure. Since there is no contact thermal resistance between the first plate portion 111 and the ridges 112 (i.e., between the first plate portion 111 and the grooves 114), the heat transfer effect is better.

The second casing 120 is stacked on the first casing 110, and includes a second plate portion 121, a plurality of support columns 122 protruding from the second plate portion 121, and a second side wall 128 protruding from the second plate portion 121 and surrounding the support columns 122. In the embodiment, the support columns 122 and the second side wall 128 are of the same height and aligned with each other, but the relationship between the support columns 122 and the second side wall 128 is not limited thereto.

The support columns 122 have consistent shapes and evenly distributed on the inner surface of the second plate portion 121, and a plurality of steam channels 124 are formed between the support columns 122. The support column 122 is, for example, a square column, but in other embodiments, the support column 122 may also be a rectangular column, a cylinder, an elliptical column, a polygonal column, a tapered column, an irregular column or/and a combination of the above. The shape and distribution of the support columns 122 are not limited thereto. The support columns 122 and the second plate portion 121 are integrally formed, but may also be bonded through other methods such as welding and gluing.

In the embodiment, these support columns 122 face the first capillary structure 113. In addition, in the embodiment, the first casing 110 and the second casing 120 are, for example, two metal casings, and the first side wall 117 is bonded to the second side wall 128 to provide good structural strength. The first side wall 117 and the second side wall 128 are, for example, bonded by diffusion bonding or welding, but the invention is not limited thereto.

In the embodiment, the first capillary structure 113 is slightly lower than the first side wall 117, and when the second capillary structure 130 is disposed on the first capillary structure 113, it is approximately aligned with the first side wall 117, so that when the first side wall 117 is bonded to the second side wall 128, the support columns 122 may press against the second capillary structure 130. Certainly, in other embodiments, the above height relationship is not limited thereto.

It should be noted that in the embodiment, an internal space surrounded by the first casing 110 and the second casing 120 may be filled with an appropriate amount of working fluid, such as water, but the type of the working fluid is not limited thereto. The working fluid, for example, flows in the grooves 114 of the first capillary structure 113 of the first casing 110 in the form of liquid. The working fluid absorbs heat in the area close to the heat source 10 and evaporates into steam. The steam channels 124 of the second casing 120 may be vacuumed so that an air pressure here is less than 1 atmospheric pressure (for example, close to vacuum) to avoid excessive pressure here during subsequent phase changes of the working fluid to cause separation of the first casing 110 and the second casing 120.

Therefore, in the embodiment, the support columns 122 abut the second capillary structure 130 and may support the second plate portion 121, so as to effectively avoid collapse of the first casing 110, the second casing 120, and the steam channels 124 during vacuum pumping. Moreover, when the working fluid condenses from gas to liquid, the working fluid may also flow downward along side walls of the support columns 122. Namely, the support columns 122 may also serve as a structure that guides the working fluid (liquid) to flow down.

In the embodiment, the second capillary structure 130 is a mesh structure woven by a plurality of wires 132, such as a copper mesh. Certainly, in other embodiments, the second capillary structure 130 may also be a non-woven mesh or a porous foam metal capillary structure, and the form of the second capillary structure 130 is not limited thereto.

It should be noted that, as shown in FIG. 4B, since the second capillary structure 130 is disposed on the grooves 114 of the first capillary structure 113, the top of the grooves 114 of the first capillary structure 113 is covered by the second capillary structure 130, and a capillary-like structure is formed in an extending direction of the grooves 114 (a direction of injecting into or out of a figure surface), and such structure allows the working fluid in the grooves 114 to resist gravity, allowing the vapor chamber 100 to complete thermal circulation well in non-horizontal conditions. Namely, the arrangement of the second capillary structure 130 not only maintains a low flow resistance advantage of the grooves 114, but also significantly improves capillary and channel functions of the first capillary structure 113, such that the vapor chamber 100 is suitable for non-horizontal placement.

Figure 4C:
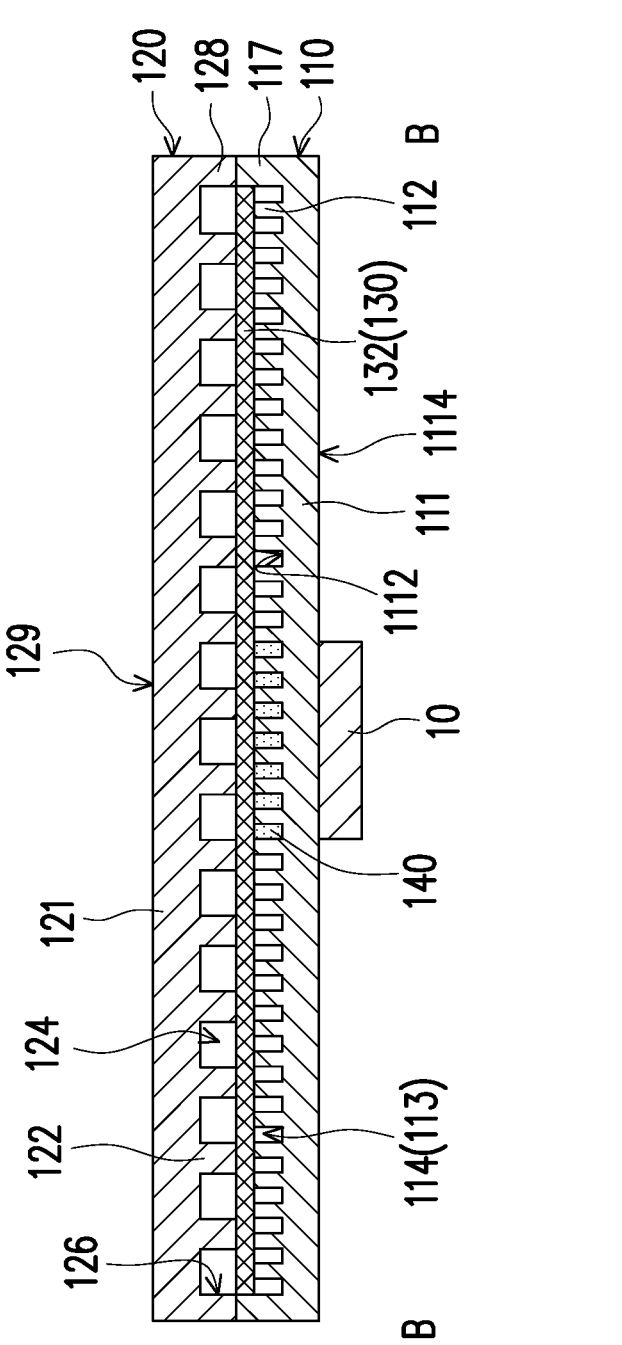
FIG. 4C is a schematic cross-sectional view of a vapor chamber according to another embodiment of the invention.

FIG. 4C is a schematic cross-sectional view of a vapor chamber according to another embodiment of the invention. Referring to FIG. 4C, in the embodiment, the vapor chamber 100 further includes a third capillary structure 140 placed near the corresponding heat source 10. In the embodiment, the third capillary structure 140 is disposed on the inner surface 1112 of the first plate portion 111 in an area corresponding to the heat source 10.

In detail, in the embodiment, since the grooves 114 of the first capillary structure 113 are evenly distributed on the first plate portion 111, a part (especially a central part) of the grooves 114 may correspond to the first plate portion 111 in an area corresponding to the heat source 10. Therefore, in the embodiment, the third capillary structure 140 is filled in the grooves 114 in the area corresponding to the heat source 10.

The second capillary structure 130 includes a plurality of pores. The third capillary structure 140 may be filled in the pores corresponding to the heat source 10. In the embodiment, the third capillary structure 140 is, for example, a sintered capillary structure. For example, metal powder or metal felt (felt?) is sintered in local areas of the grooves 114 and the pores to further increase a capillary force there and improve an anti-drying ability. Certainly, in other embodiments, the form of the third capillary structure 140 is not limited thereto. In addition, in an embodiment that is not shown, the second capillary structure 130 may also be a metal foam layer with a large number of pores inside, and the third capillary structure 140 (metal powder) is filled in the pores of the metal foam layer and the grooves 114 of the first capillary structure 113.

It may be seen from FIG. 4C that the first casing outer surface 1114 of the first casing 110 of the vapor chamber 100 contacts the heat source 10, and the heat emitted by the heat source 10 may be transferred to the first casing 110. The area of the vapor chamber 100 corresponding to the heat source 10 is referred to as an evaporation zone. In the evaporation zone, the liquid located in the grooves 114 absorbs heat and vaporizes into steam. The working fluid (gas) may flow upward to the steam channels 124 of the second casing 120 and diffuse in an internal steam cavity of the second casing 120, and then condense into liquid in a condensation area of the vapor chamber 100 (such as an outer surface of the second casing of the vapor chamber, or a selected area of the first casing outer surface 1114 that is not in contact with the heat source 10), and dissipate the heat out of the vapor chamber 100 and condense into liquid. The condensed working fluid (liquid) flows downward to the grooves 114 of the first casing 110, and flows to the third capillary structure 140 by the capillary force in the grooves 114, thereby completing the cycle.

It should be noted that in the embodiment, the third capillary structure 140 is filled in the grooves 114 of the first capillary structure 113 and the pores of the second capillary structure 130 in the evaporation zone, and since the sintered material may provide a good capillary environment for the liquid, the working fluid may be easily sucked into the evaporation zone to avoid a situation that the liquid in the evaporation zone is vaporized and cannot be replenished in time, so as to provide good anti-drying ability.

Moreover, the grooves 114 of the first capillary structure 113 and the pores of the second capillary structure 130 are not configured with the third capillary structure 140 in areas not corresponding to the heat source 10, which maintains low flow resistance. Namely, since the third capillary structure 140 is only disposed in the first capillary structure 113 near the position corresponding to the heat source 10, it does not block the path through which the liquid flows back.

In this way, the vapor chamber 100 may greatly increase a maximum heat dissipation amount through the above design without increasing a thickness (a thickness of the first capillary structure 113 and the second capillary structure 130 original adopted may be maintained), so as to be suitable for being used in thin devices. After testing, compared with the vapor chamber without configuring the third capillary structure 140, the maximum heat dissipation amount of the vapor chamber 100 of the embodiment may be increased by at least 50%, so as to achieve good performance.

Figure 4D:
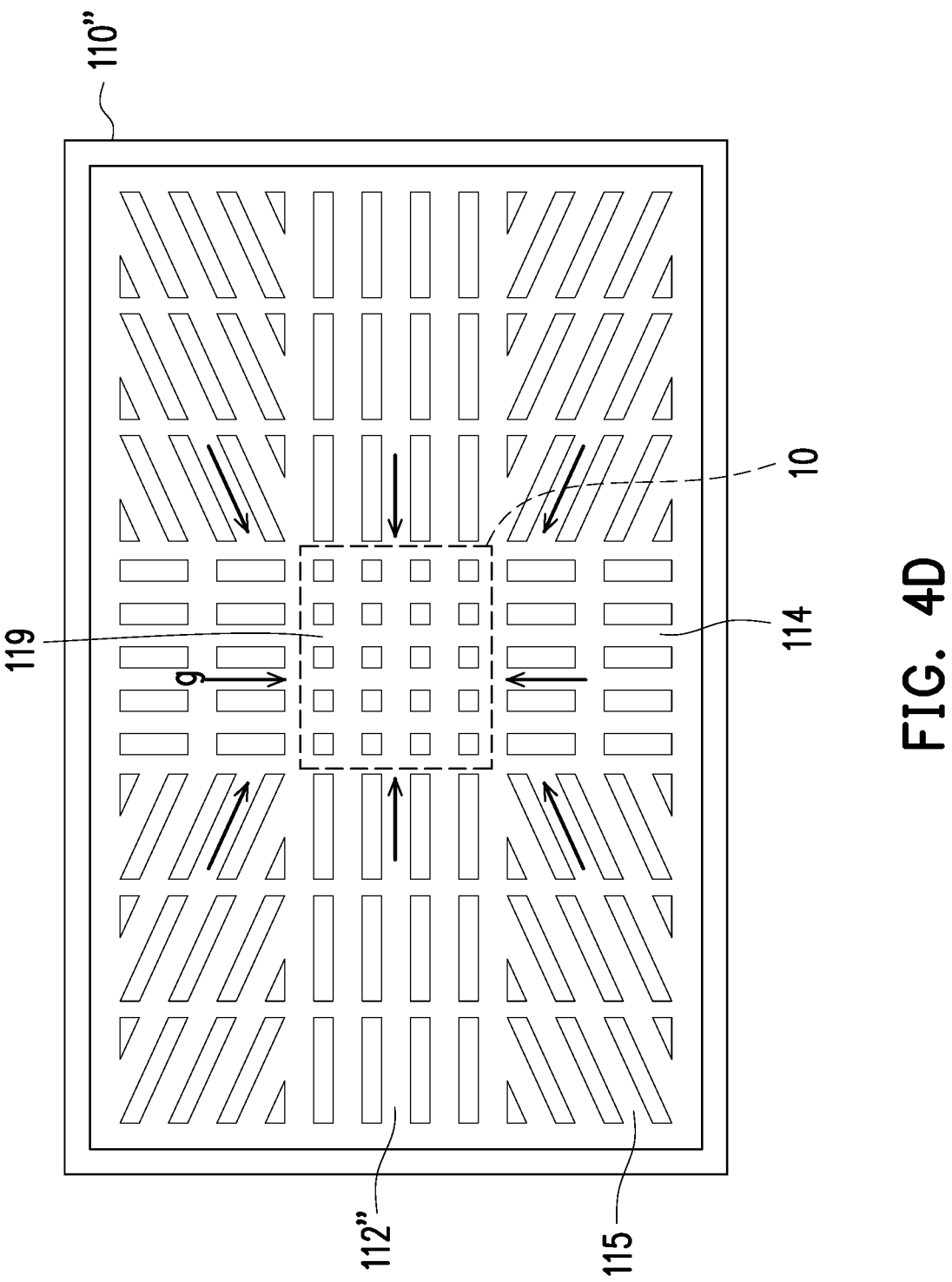
FIG. 4D is an internal schematic diagram of a first casing of a vapor chamber according to another embodiment of the invention.

FIG. 4D is an internal schematic diagram of a first casing of a vapor chamber according to another embodiment of the invention. Referring to FIG. 4D, in the embodiment, a first casing 110" has a variety of grooves 114, 112", 115, 118, and 119 with different directions. These grooves are radially arranged to reduce a flow resistance and allow the condensed working fluid g (liquid) to flow back quickly. A groove arrangement pattern on the inner surface of the first casing 110" is not limited to a radial pattern, and any arrangement pattern sufficient to guide the working fluid g (liquid) may be used. Certainly, in other embodiments, the grooves of the first casing may also be arranged in a single direction only, or the grooves of the first casing may be arranged in multiple non-radial directions.

Figure 4E:
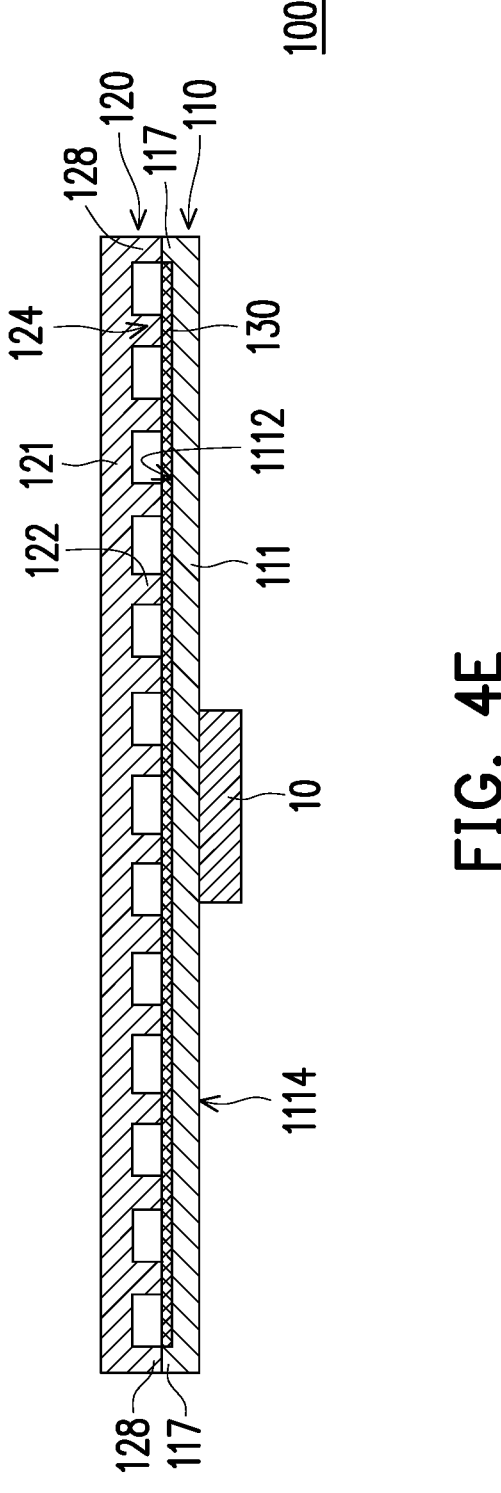
FIG. 4E is a schematic cross-sectional view of a vapor chamber according to another embodiment of the invention.

FIG. 4E is a schematic cross-sectional view of a vapor chamber according to another embodiment of the invention. Referring to FIG. 4E, in the embodiment, a vapor chamber 100' has only a single capillary structure (for example, the second capillary structure 130). The second capillary structure 130 is a mesh structure woven by a plurality of wires, such as a copper mesh. Certainly, in other embodiments, the second capillary structure 130 may also be a non-woven mesh or a porous foam metal capillary structure, and the form of the second capillary structure 130 is not limited thereto. In addition, the type of the capillary structure of the vapor chamber 100' is not limited thereto.

Figure 5A:
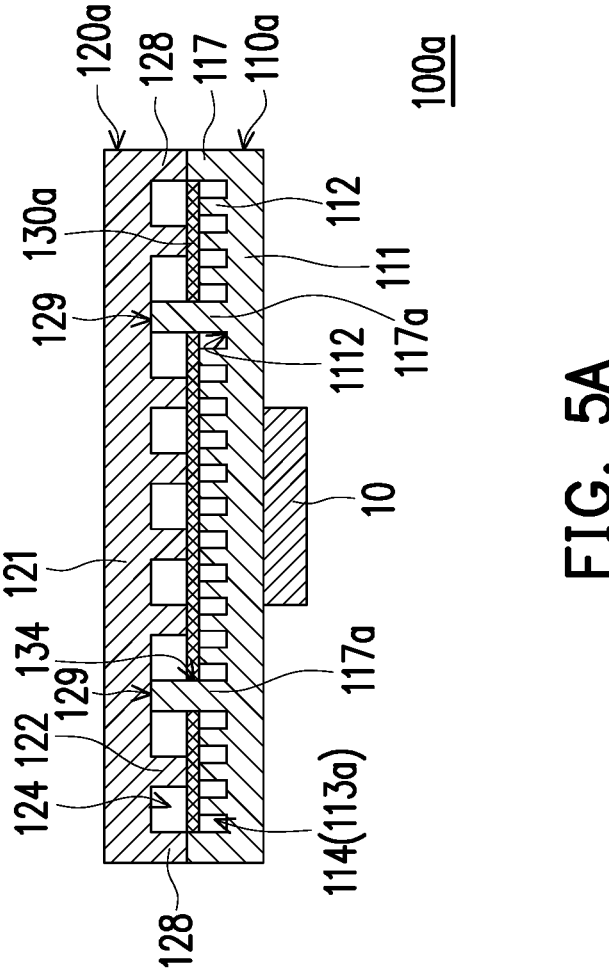
FIG. 5A is a schematic cross-sectional view of a vapor chamber according to another embodiment of the invention.

FIG. 5A is a schematic cross-sectional view of a vapor chamber according to another embodiment of the invention.

Figure 5B:
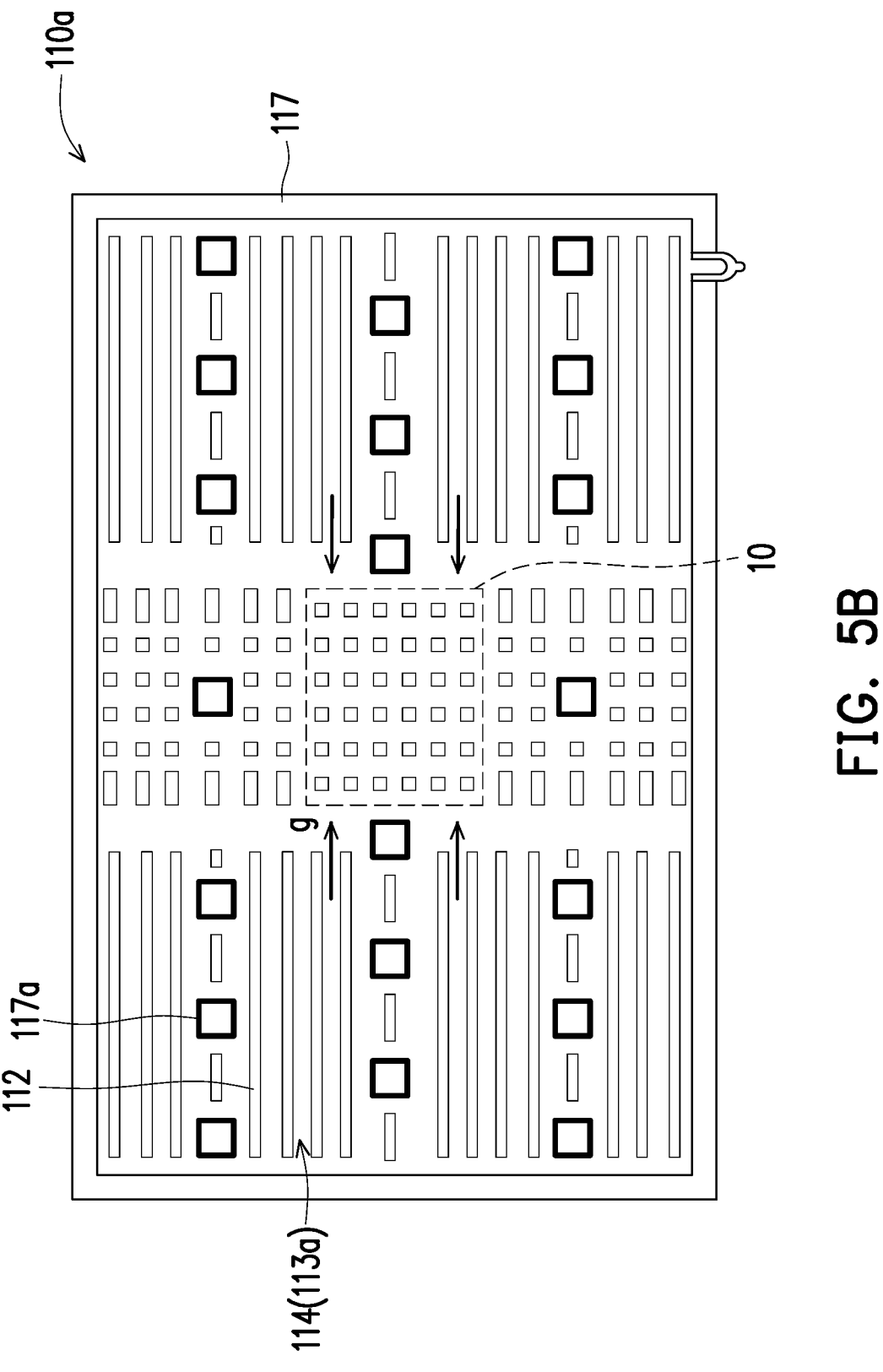
FIG. 5B is an internal schematic diagram of a first casing of the vapor chamber of FIG. 5A.
Figure 5C:
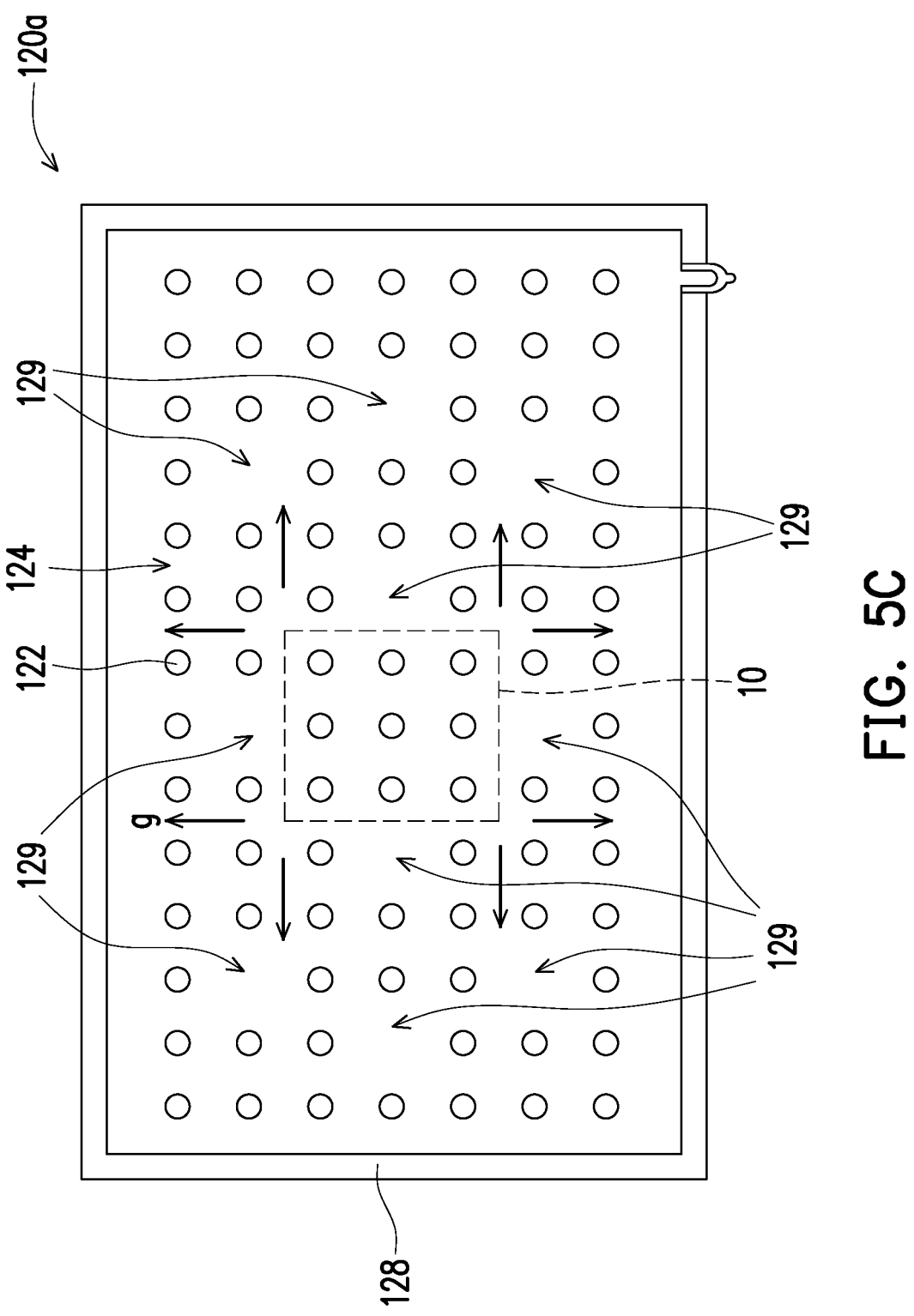
FIG. 5C is an internal schematic diagram of a second casing of the vapor chamber of FIG. 5A.

FIG. 5B is an internal schematic diagram of a first casing of the vapor chamber of FIG. 5A. FIG. 5C is an internal schematic diagram of a second casing of the vapor chamber of FIG. 5A.

It should be noted that the cross-section in FIG. 5A is a cross-section along a width direction of the vapor chamber, which is different from the cross-section in a length direction of the vapor chamber in FIG. 4B. In addition, in FIG. 5B, the ridges 112 are represented by thin lines, and first protruding portions 117a are represented by thick lines.

A vapor chamber 100a of the embodiment includes a first casing 110a, a first capillary structure 130a and a second casing 120a. A material of the first casing 110a and the second casing 120a is metal, such as aluminum or aluminum alloy, but the invention is not limited thereto. In other embodiments, the material of the first casing 110a and the second casing 120a may also include other metals such as copper or copper alloy.

The first casing 110a includes a first plate portion 111, a plurality of first protruding portions 117a protruding from an inner surface 1112 of the first plate portion 111, and a first side wall 117 protruding from the inner surface 1112 and surrounding the first protruding portions 117a. The heat source 10 is adapted to contact an outer surface 1114 of the first plate portion 111 to transfer the thermal energy generated by the heat source 10 to the vapor chamber 100a.

In the embodiment, the first protruding portions 117a are columnar, and the first protruding portions 117a are evenly distributed on the inner surface 1112. Certainly, in other embodiments, the first protruding portions 117a may also be long strips, and the first protruding portions 117a may also be unevenly distributed. The shape and distribution of the first protruding portions 117a are not limited by the invention. In the embodiment shown in FIG. 5B, although the first protruding portions 117a are not placed in the evaporation zone corresponding to the thermal source 10, the first protruding portions 117a may be partially located in the evaporation zone corresponding to the thermal source 10. The second protruding portions 122 on the second plate portion 121 corresponding to the first protruding portions 117a may be partially removed to form bonding areas 129.

In the embodiment, the first plate portion 111 and the first protruding portions 117a are formed integrally, and such design may achieve a simple structure. In addition, since there is no contact thermal resistance between the first plate portion 111 and the first protruding portions 117a, a heat transmission effect is better. The first plate portion 111 and the first protruding portions 117a are produced by processes such as stamping, chemical etching, forging, or die casting, but the invention is not limited thereto.

As shown in FIG. 5A, the first capillary structure 130a is disposed on the inner surface 1112 of the first plate portion 111 and surrounds the first protruding portions 117a. In the embodiment, the first capillary structure 130a is a mesh structure woven by a plurality of wires, for example, a metal mesh such as copper mesh or aluminum mesh, etc. Certainly, in other embodiments, the first capillary structure 130a may also be a non-woven mesh or a porous foam metal capillary structure. The first capillary structure 130a may also be sintered metal powder capillary, and the form of the first capillary structure 130a is not limited thereto. Since the first capillary structure 130a includes a plurality of pores, a capillary force may be provided within the pores.

The second casing 120a is stacked on the first casing 110a. The second casing 120a includes a second plate portion 121, a plurality of second protruding portions 122 protruding from the second plate portion 121, and a second side wall 128 protruding from the second plate portion 121 and surrounding the second protruding portions 122. In the embodiment, the second protruding portions 122 are at a same height level and aligned with the second side wall 128, but the relationship between the second protruding portions 122 and the second side wall 128 is not limited thereto.

The first side wall 117 is bonded to the second side wall 128. In the embodiment, the bonding between the first side wall 117 and the second side wall 128 may be achieved by stamping shear, diffusion bonding, hard welding, soft welding, laser fusion welding, or arc fusion welding to achieve a sealing effect.

In order to increase a structural strength of the vapor chamber 100a, the vapor chamber 100a of the embodiment intentionally set the first protruding portions 117a in the area within the first side wall 117 of the first casing 110a. In addition, as shown in FIG. 5C, the second plate portion 121 includes a plurality of bonding areas 129 provided through displacement of the second protruding portions 122. When the first side wall 117 is bonded to the second side wall 128, the first protruding portions 117a are bonded to the bonding areas 129 of the second plate portion 121. The bonding areas 129 between the first protruding 117a and the second plate portion 121 may achieve bonding of the first protruding 117a and the second plate portion 121 through resistance welding during a cold work; and during a hot work, the bonding may be achieved through diffusion bonding, etc., so as to enhance the connectivity between the first casing 110a and the second casing 120a to achieve characteristics of full anti-expansion.

In the embodiment, since the first protruding portions 117a and the second protruding portions 122 are misaligned with each other, the first casing 110a and the second casing 120a do not need to be accurately aligned. Even if there is any deviation between the first casing 110a and the second casing 120a during the fabrication process, it will be no impact on bonding between the first protrusion portions 117a and the bonding areas 129 of the second plate portion 121. The process is convenient, and the first casing 110a may be directly bonded to the second plate portion 121 through the first protruding portions 117a, which is easy to maintain a bonding strength between the first casing 110a and the second casing 120a.

In addition, as shown in FIG. 5A, the second protruding portions 122 lean against the first capillary structure 130a, which helps to fix a distance between the first plate portion 111 and the second plate portion 121, which not only ensures a flatness of the first capillary structure 130a, but also avoids collapse and deformation of the vapor chamber 100a due to internal pressure changes, thereby effectively increasing a service life of the vapor chamber 100a. In the embodiment, a difference between a height of the first protruding portions 117a protruding from the first plate portion 111 and a height of the second protruding portions 122 protruding from the second plate portion 121 is a height of a capillary layer.

In addition, in the embodiment, a number of the second protruding portions 122 is greater than a number of the first protruding portions 117a. A plurality of steam channels 124 are formed between the second protruding portions 122. The second protruding portions 122 are used as structures to define the steam channels, guiding structures for guiding the steam condensed liquid to flow downward along the second protruding portions 122, and support structures to prevent collapse of the first casing 110a and the second casing 120a. Therefore, the larger number of the second protruding portions 122 may provide more steam channels 124, guidance structures, and support structures.

In addition, in the embodiment, a size of the first protruding portion 117a is larger than a size of the second protruding portion 122. The first protruding portions 117a are mainly used as a connecting structure for connecting the second plate portion 121, so that the larger size of the first protruding portions 117a may provide a larger bonding area. Certainly, the size and quantity relationship between the first protruding portions 117a and the second protruding portions 122 are not limited thereto.

In addition, since the first protruding portions 117a are directly connected to the second plate portion 121 in the embodiment, the first protrusion portions 117a may also be used as structures for defining a portion of the steam channels, and may have the effect of providing the steam condensed liquid to flow downward along the first protrusion portions 117a. The first protruding portions 117a and the second protruding portions 122 may significantly shorten a path length of liquid reflux, which may effectively reduce a flow resistance.

In the embodiment, the second protruding portions 122 are, for example, cylinders, and shapes of the second protruding portions 122 are consistent, but the shapes of the second protruding portions 122 are not limited thereto. In other embodiments, the second protruding portions 122 may also be rectangular columns, square columns, elliptical columns, polygonal columns, conical columns, irregular columns, or a combination of the above. The shapes and distribution of the second protruding portions 122 are not limited thereto. In addition, in the embodiment, the second protruding portions 122 and the second plate portion 121 are integrally formed, and the second plate portion 121 and the second protruding portions 122 are, for example, produced through stamping, chemical etching, forging, or die casting, but the invention is not limited thereto.

In addition, in the embodiment, viewing from the cross-section of FIG. 5A, a cross-sectional shape of the second protruding portion 122 is a rectangle. However, in other embodiments, the cross-sectional shape of the second protruding portion 122 may also be an inverted trapezoid. Therefore, a cross-sectional shape of the constructed steam channel 124 is a trapezoid. In other embodiments, the second protruding portions 122 may include a plurality of conical columns, a plurality of trapezoidal columns, a plurality of cylinders, or a plurality of irregularly shaped columns. Therefore, the cross-sectional shapes of the second protruding portions 122 may be triangles, arcs, or other shapes. Similarly, the cross-sectional shapes of the steam channels 124 may be triangles, arcs, or other shapes.

It should be noted that in the embodiment, an appropriate amount of working fluid g (indicated in FIG. 5C, and the working fluid g of FIG. 5C is a vapor) may be filled into the internal space surrounded by the first casing 110a and the second casing 120a. The working fluid g is, for example, acetone that is compatible with an aluminum container, but the type of the working fluid g is not limited thereto. In other embodiments, the working fluid g may also be water or other types of working fluids, as long as it may be matched with the container material of the vapor chamber. The working fluid g, for example, flows in a liquid form within the first casing 110a.

The outer surface 1114 (indicated in FIG. 5A) of the first casing 110a of the vapor chamber 100a contacts the heat source 10, and the heat emitted by the heat source 10 may be transferred to the first casing 110a. The area of the vapor chamber 100a corresponding to the heat source 10 is referred to as an evaporation zone. In the evaporation zone, the working fluid g (liquid) absorbs heat and vaporizes into vapor (steam). The working fluid g (vapor) may flow upward to the steam channels 124 of the second casing 120a and diffuse in the internal of the second casing 120a, and then condense into liquid in a condensation area of the vapor chamber (for example, an area of the second casing 120a or the first casing 110a of the vapor chamber 100a outside a projection of the heat source 10), and expel the heat out of the vapor chamber 100a. When the working fluid g condenses from gas to liquid, the working fluid g may flow downward along the side walls of the second protruding portions 122 and the first protruding portions 117a. The condensed working fluid g (liquid) flows back downward to the area near the heat source 10 to evaporate, thereby completing the thermal cycle.

In the embodiment, the steam channels 124 of the second casing 120a may be vacuumed so that a pressure therein is less than 1 atmospheric pressure (for example, close to vacuum), so as to avoid excessive pressure here during subsequent phase changes of the working fluid g to cause separation of the first casing 110 and the second casing 120.

It should be noted that in the embodiment, the second protruding portion 122 abut the first capillary structure 130a and may support the second plate portion 121, so as to effectively avoid collapse of the first casing 110, the second casing 120, and the steam channels 124 during vacuum pumping. Moreover, the first protruding portions 117a may be connected to the corresponding bonding areas 129, so that the pressure between the first plate portion 111 and the second plate portion 121 is greater than 1 atmospheric pressure (i.e., a saturation pressure corresponding to an operating temperature of the vapor chamber is higher than an ambient pressure), a distance between the first plate part 111 and the second plate part 121 may be maintained constant, thereby preventing expansion and deformation of the vapor chamber 100a.

In addition, as shown in FIG. 5A, in the embodiment, the first casing 110a comprises a second capillary structure 113a that protrudes integrally from the inner surface 1112 of the first plate portion 111. The second capillary structure 113a includes a plurality of grooves 114 formed between a plurality of ridges 112 to serve as liquid channels.

More specifically, the ridges 112 protrude from the inner surface 1112 of the first plate portion, so that the grooves 114 are defined between every two adjacent ridges 112. In the embodiment, the first plate portion 111 is integrally formed with the ridges 112, and such design may have a relatively simple structure. Since there is no contact thermal resistance between the first plate portion 111 and the ridges 112 (i.e., between the first plate portion 111 and the grooves 114), the heat transfer effect is better.

The working fluid g (FIG. 5C), for example, flows in a liquid form within the grooves 114 of the second capillary structure 113a of the first casing 110a. The second capillary structure 113a adopts the design of the grooves 114 to provide a smaller flow resistance. In the embodiment, a width of the groove 114 is, for example, between 50 μm and 200 μm, and a depth of the groove 114 is, for example, between 50 μm and 200 μm. However, the width and depth of the groove 114 are not limited thereto.

As shown in FIG. 5A, a height of the first protruding portions 117a is greater than a height of the ridges 112. The first protruding portions 117a pass through the first capillary structure 130a, and are configured between the second capillary structure 113a and the second protruding portions 122 of the second casing 120a through the first capillary structure 10a. Since the first capillary structure 130a is disposed on the grooves 114 of the second capillary structure 113a, the top of the grooves 114 of the second capillary structure 113a is covered by the first capillary structure 130a, and a capillary-like structure is formed in an extending direction of the grooves 114 (a direction of injecting into or out of a figure surface), and such structure allows the working fluid in the grooves 114 to resist gravity, allowing the vapor chamber 100a to complete thermal circulation well in non-horizontal conditions.

Therefore, in the embodiment, by covering a layer of mesh-like first capillary structure 130a on the open grooves 114 of the second capillary structure 113a, not only a low flow resistance advantage of the grooves 114 is maintained, but also a capillary force is significantly improved, such that the vapor chamber 100a is suitable for non-horizontal placement.

In addition, as shown in FIG. 5B, in the embodiment, a length of the ridge 112 is larger in left and right regions of the first plate portion 111 in a length direction, and smaller in a central region of the first plate portion 111 in the length direction. In addition to reducing the probability of depression of the second casing 120, the design of the ridges 112 with different lengths in different regions may make it easier for the condensed liquid in the first casing 110 to flow back to the evaporation zone.

Figure 5D:
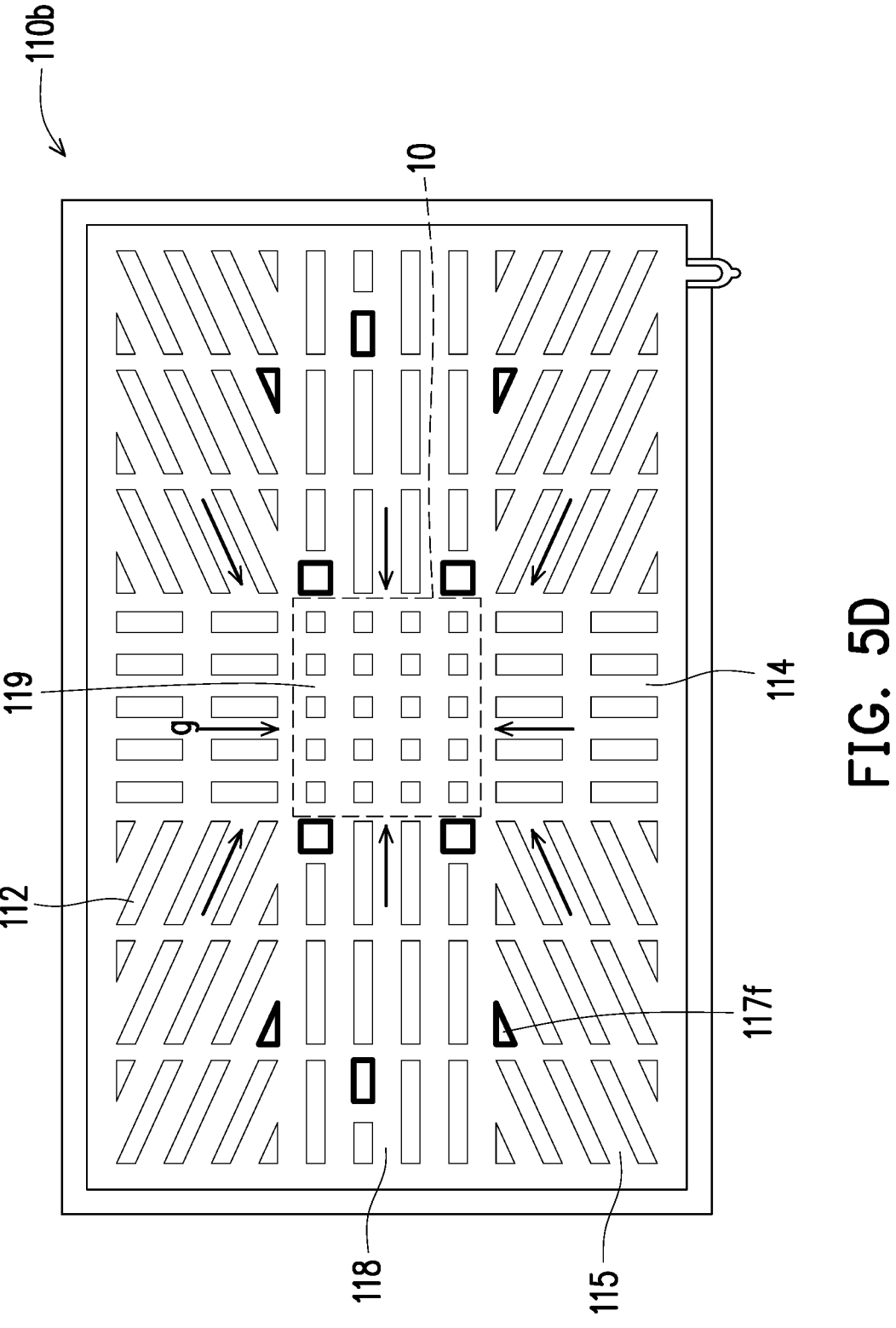
FIG. 5D is an internal schematic diagram of a first casing of a vapor chamber according to another embodiment of the invention.

FIG. 5D is an internal schematic diagram of a first casing of a vapor chamber according to another embodiment of the invention. Referring to FIG. 5D, in the embodiment, the first protruding portions 117b and at least a part of the ridges 112 are radially arranged, such that at least a part of the grooves 114, 115, and 118 are radially arranged. In addition, the grooves 119 of the first casing 110b at a portion corresponding to the heat source 10 are arranged in a checkerboard pattern. Certainly, in an embodiment, it is also possible to only arrange the ridges 112 radially, which is not limited by the figure.

Specifically, in the embodiment, the first casing 110b has the plurality of grooves 114, 115, 118, 119 with different directions. These grooves 114, 115, 118 adopt a radial shape to reduce flow resistance and allow the condensed working fluid g (liquid) to quickly flow back. The grooves 114, 115, and 118 on the inner surface 1112 of the first casing 110b are not limited to be radially arranged and may be arranged in any form that is sufficient to guide the working fluid g (liquid).

It should be noted that, in an embodiment, the first protruding portions may be evenly distributed in areas outside the evaporation zone. In another embodiment, the first protruding portions may also be non-uniformly distributed in areas outside the evaporation zone. The shape and size of the first protruding portions are not limited by the invention. In other embodiments, the first protruding portions may also be partially located in the evaporation zone, which is not limited by the drawings.

Figure 5E:
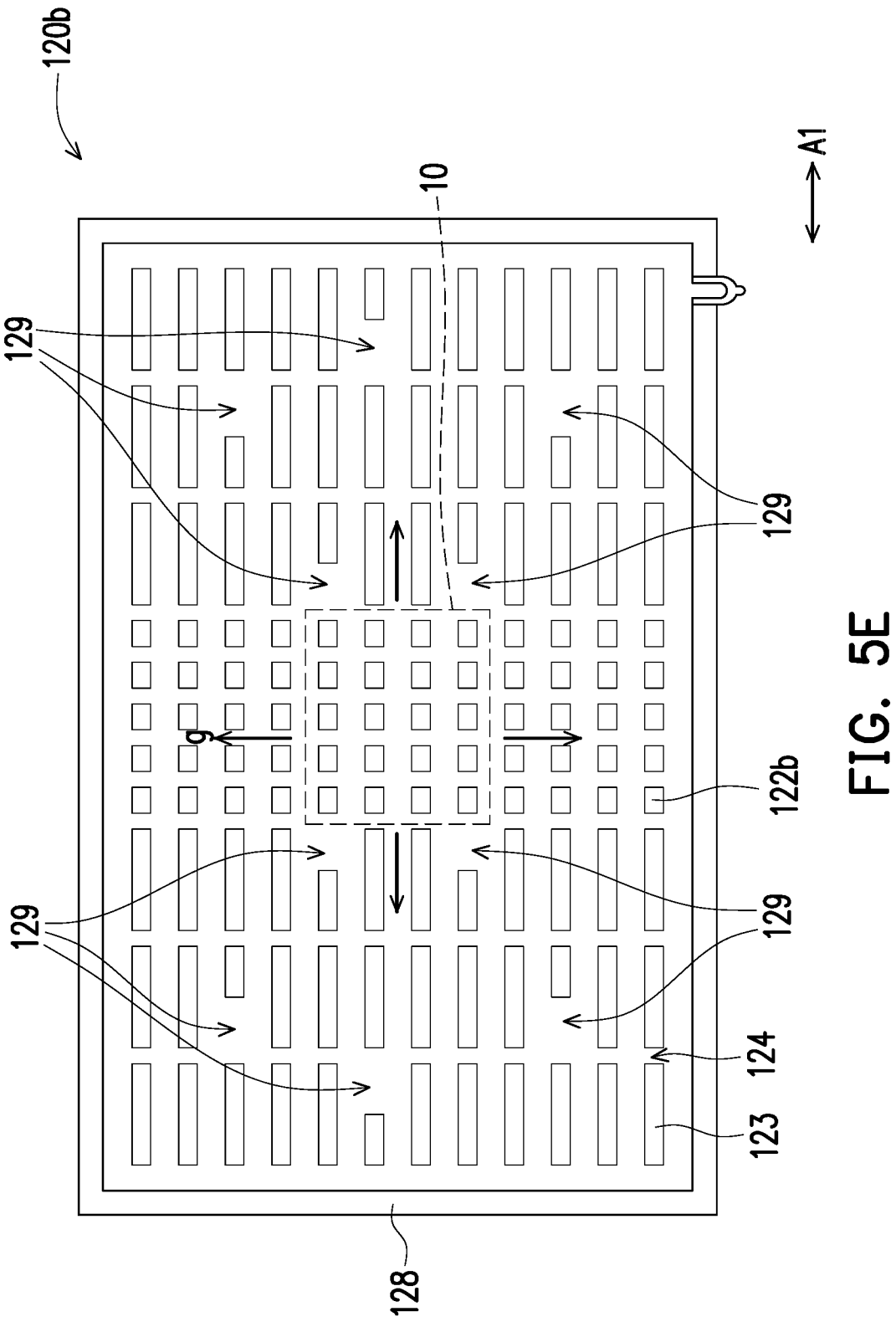
FIG. 5E is an internal schematic diagram of a second casing of a vapor chamber according to another embodiment of the invention.

FIG. 5E is an internal schematic diagram of a second casing of a vapor chamber according to another embodiment of the invention. Referring to FIG. 5E, in the embodiment, the second protruding portions include a plurality of first support columns 122b and a plurality of second support columns 123. A shape of the first support column 122b is different from a shape of the second support column 123. The first support columns 122b are configured at a portion corresponding to the heat source 10, and the second support columns 123 are located next to the first support columns 122b and extend along an axial direction A1.

In the embodiment, the second casing 120 is provided with the high-density first support columns 122b at the portion corresponding to the heat source 10, so as to provide good a structural strength. The second support columns 123 are located on both sides of the first support columns 122b and extend along the axial direction AI, which may guide a flow direction of the working fluid g (vapor). In addition, in the embodiment, the second support columns 123 are partially displaced to form the bonding areas 129 for bonding the first protruding portions 117a (as shown in FIG. 5A).

Figure 6A:
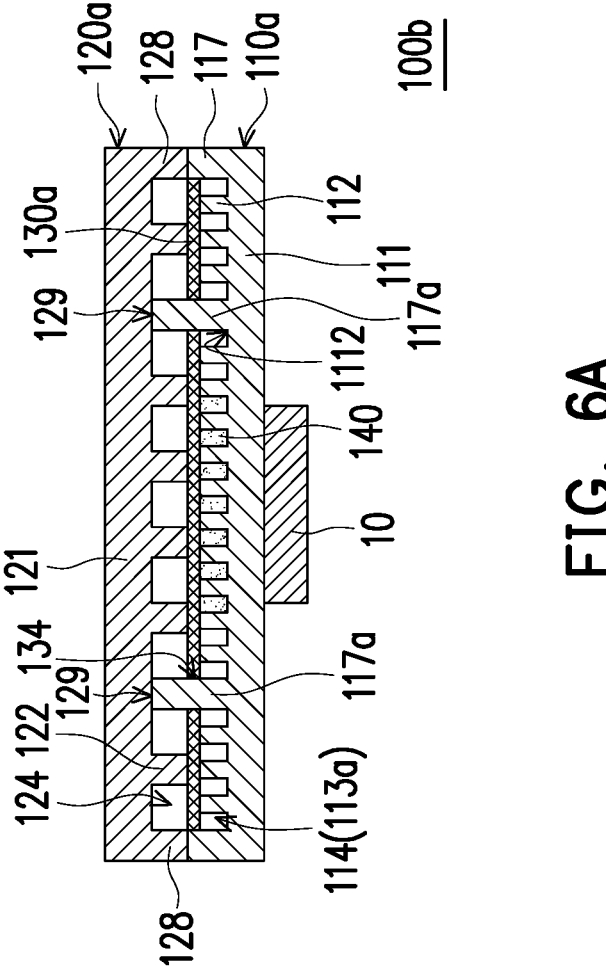
FIG. 6A is a schematic cross-sectional view of a vapor chamber according to another embodiment of the invention.
Figure 6B:
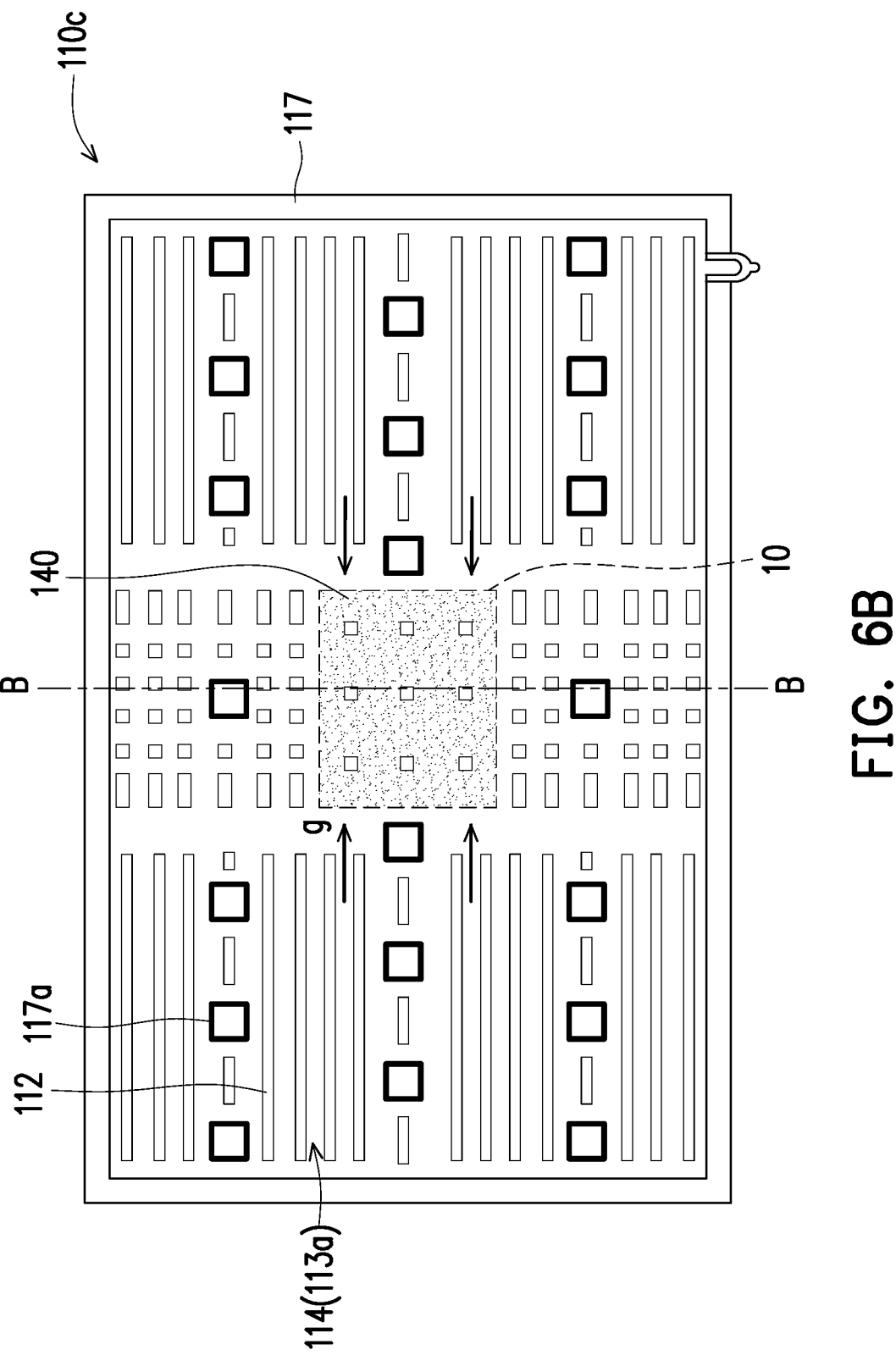
FIG. 6B is an internal schematic diagram of a first casing of the vapor chamber in FIG. 6A.

FIG. 6A is a schematic cross-sectional view of a vapor chamber according to another embodiment of the invention. FIG. 6B is an internal schematic diagram of a first casing of the vapor chamber in FIG. 6A. Similarly, the cross-section of FIG. 6A, like FIG. 5A, is in a width direction of the vapor chamber.

Referring to FIG. 6A and FIG. 6B, in the embodiment, a vapor chamber 100b further includes a third capillary structure 140, which is filled in the area corresponding to the heat source 10 in the second capillary structure 113a. Namely, the third capillary structure 140 is added to the area with the highest heat flux in the evaporation zone, and this area has fewer support columns.

The third capillary structure 140 includes metal powder or non-woven metal felt. In the embodiment, the third capillary structure 140 is, for example, a sintered capillary structure, for example, metal powder is sintered in a partial area of the grooves 114. Certainly, in other embodiments, the form of the third capillary structure 140 is not limited thereto. The first capillary structure 130 may also be a metal foam layer with a large number of pores inside, and the third capillary structure 140 (metal powder) may also be filled into these pores in the metal foam layer.

In the embodiment, by adding metal powder or metal felt with stronger capillary force to the second capillary structure 113a near the heat source 10, the capillary force at that location may be further improved, which improves the anti-drying ability. In addition, since the third capillary structure 140 is only configured at the portion corresponding to the heat source 10 in the second capillary structure 113a, it does not block the path through which the liquid flows back.

It should be noted that in the embodiment, since the third capillary structure 140 at the area corresponding to the heat source 10 has the stronger capillary force, and the grooves 114 in the second capillary structure 113a covered by the first capillary structure 130a having both lower flow resistance and stronger capillary force, by appropriately matching these three capillary structures, the working liquid may flow back more quickly to the evaporation zone close to the heat source 10, making the evaporation zone of the vapor chamber less likely to dry out and providing better heat dissipation performance.

Figure 7:
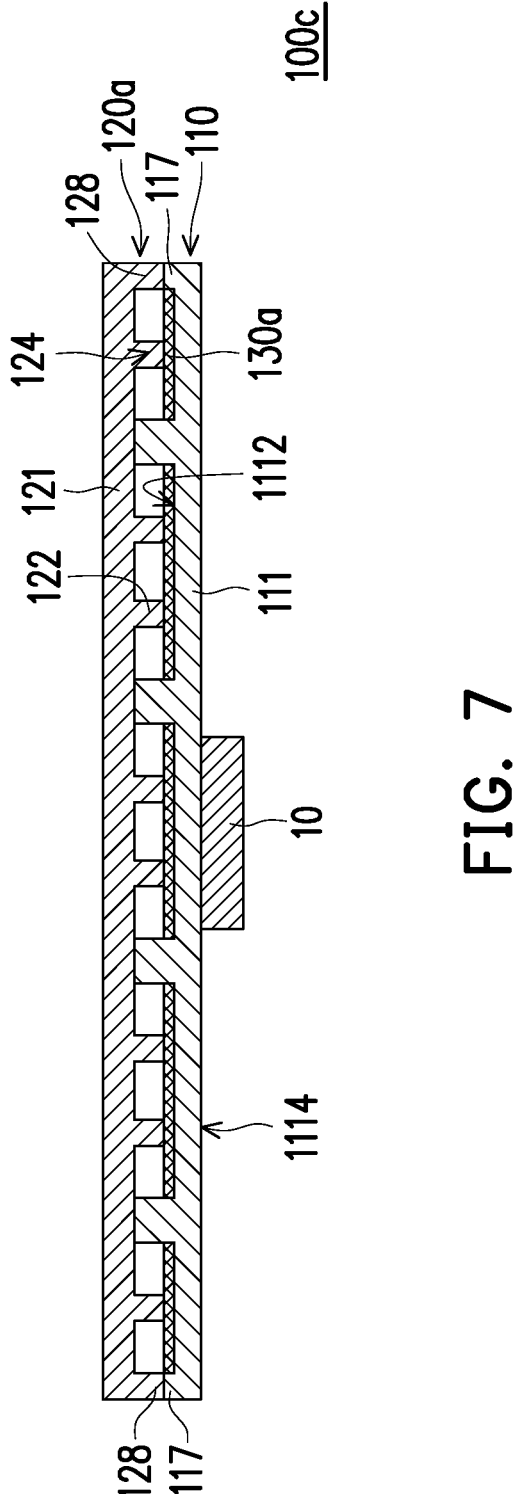
FIG. 7 is a schematic cross-sectional view of a vapor chamber according to another embodiment of the invention.

FIG. 7 is a schematic cross-sectional view of a vapor chamber according to another embodiment of the invention. It should be noted that FIG. 7 shows a cross-section of the vapor chamber in a long side direction. Referring to FIG. 7, a main difference between a vapor chamber 100c in FIG. 7 and the vapor chamber 100a in FIG. 5A is that in FIG. 7, the vapor chamber 100c only has a single capillary structure (for example, the first capillary structure 130a). The first capillary structure 130a is a mesh structure woven by a plurality of wires, such as a copper mesh. Certainly, in other embodiments, the first capillary structure 130a may also be a non-woven mesh or a porous foam metal capillary structure, and the form of the first capillary structure 130a is not limited thereto. In addition, the type of the capillary structure of the vapor chamber 100c is not limited thereto.

In summary, the vapor chamber and the heat pipe set of the heat dissipation device of the invention are adapted for thermal coupling to the heat source, and the heat from the heat source is synchronously conducted to the vapor chamber and the heat pipe set. The vapor chamber is thermally coupled to the heat dissipation fin set, and the heat pipe set penetrates through the heat dissipation fin set. Therefore, the heat from the heat source may be synchronously conducted to the vapor chamber and the heat pipe set, and a heat dissipation path may be increased to effectively improve the heat dissipation efficiency.

What is claimed is:

1. A heat dissipation device, adapted to dissipate heat of a heat source, and comprising:
    a vapor chamber, adapted for thermal coupling to the heat source;
    a heat pipe set including a compressed portion adapted for thermal coupling to the heat source;
    a heat dissipation fin set, wherein the vapor chamber is thermally coupled to the heat dissipation fin set, and the heat pipe set penetrates through the heat dissipation fin set; and
    a heat conduction structure including a body,
    wherein the vapor chamber and the heat pipe set are in direct contact with the body such that heat from the heat source is synchronously conducted to the vapor chamber and the heat pipe set through the body,
    wherein the heat dissipation fin set directly contacts a top surface of the vapor chamber,
    wherein the vapor chamber directly contacts a top surface of the body and the compressed portion,
    wherein the compressed portion directly contacts the heat source and a side surface of the body, and
    wherein a bottom surface of the body directly contacts the heat source.

2. The heat dissipation device as claimed in claim 1, wherein the heat dissipation fin set comprises an upper half and a lower half, the lower half is located between the upper half and the vapor chamber, the heat pipe set comprises a round tube portion, and the round tube portion penetrates through the upper half of the heat dissipation fin set.

\* \* \* \* \*